US012730157B2

(12) United States Patent
Ozaki

(10) Patent No.: US 12,730,157 B2
(45) Date of Patent: Sep. 8, 2026

(54) DISTRIBUTED CONTROL DEVICE AND DISTRIBUTED CONTROL SYSTEM

(71) Applicant: SEIKO EPSON CORPORATION, Tokyo (JP)

(72) Inventor: Shinji Ozaki, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 364 days.

(21) Appl. No.: 18/621,204

(22) Filed: Mar. 29, 2024

(65) Prior Publication Data

US 2024/0329152 A1 Oct. 3, 2024

(30) Foreign Application Priority Data

Mar. 31, 2023 (JP) ................................ 2023-057912

(51) Int. Cl.
*H02J 3/38* (2026.01)
*G01R 19/165* (2006.01)
*G01R 31/40* (2020.01)

(52) U.S. Cl.
CPC ....... *G01R 31/40* (2013.01); *G01R 19/16576* (2013.01); *H02J 3/38* (2013.01)

(58) Field of Classification Search
CPC ...... G01R 31/40; G01R 19/16576; H02J 3/38
USPC .......................................................... 700/286
See application file for complete search history.

(56) References Cited

U.S. PATENT DOCUMENTS

2015/0062614 A1 3/2015 Takatani
2016/0094023 A1* 3/2016 Kubota .................. H02M 1/32 361/93.1
2019/0064904 A1* 2/2019 Motohashi ................ H02J 9/06
2019/0238057 A1* 8/2019 Okamoto ............... H02M 1/08

FOREIGN PATENT DOCUMENTS

JP 2015-049731 A 3/2015

* cited by examiner

*Primary Examiner* — Jigneshkumar C Patel
(74) *Attorney, Agent, or Firm* — Spencer Fane LLP

(57) ABSTRACT

There is provided a distributed control device including a first power supply circuit that outputs a first power supply voltage, a power failure detection circuit that outputs a power failure notification signal, a first drive power supply circuit that outputs a first drive voltage, a second drive power supply circuit that outputs a second drive voltage, a control circuit operated by using the first drive voltage, and a first drive device operated by using the second drive voltage. The power failure detection circuit outputs the power failure notification signal including power failure information indicating that the commercial power supply is abnormal. The first switching circuit stops supply of the first power supply voltage to the second drive power supply circuit in accordance with a first switching control signal based on the power failure notification signal including the power failure information.

7 Claims, 11 Drawing Sheets

FIG. 3

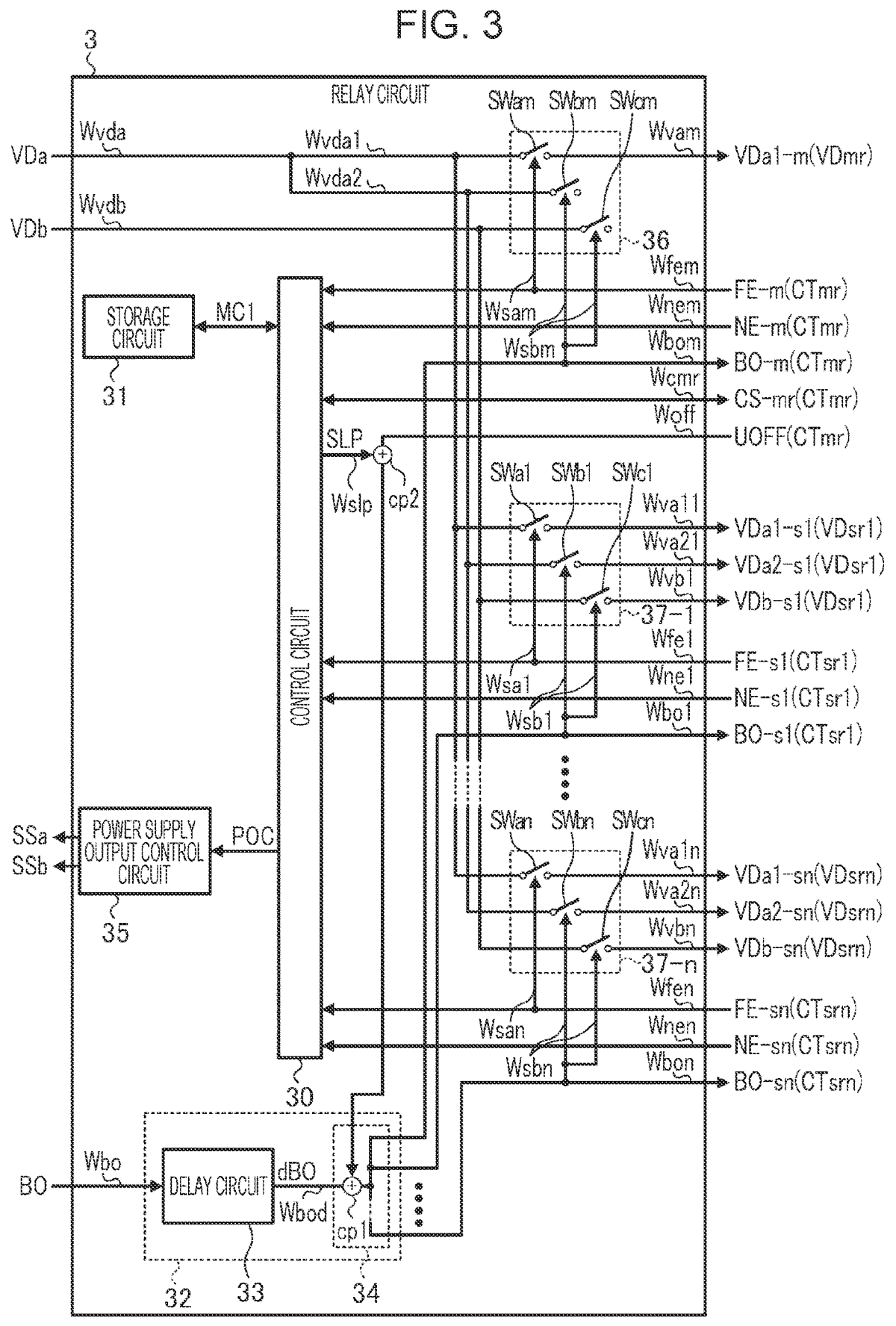

3
RELAY CIRCUIT
SWam SWbm SWcm
Wvda
Wvda1
Wvam
VDa
VDa1-m(VDmr)
Wvda2
Wvdb
VDb
36
Wfem
FE-m(CTmr)
STORAGE CIRCUIT
MC1
Wsam
Wnem
NE-m(CTmr)
Wsbm
Wbom
BO-m(CTmr)
31
Wcmr
CS-mr(CTmr)
Woff
UOFF(CTmr)
SLP
Wslp
cp2
SWa1 SWb1 SWc1
Wva11
VDa1-s1(VDsr1)
Wva21
VDa2-s1(VDsr1)
Wvb1
VDb-s1(VDsr1)
CONTROL CIRCUIT
37-1
Wfe1
FE-s1(CTsr1)
Wsa1
Wne1
NE-s1(CTsr1)
Wsb1
Wbo1
BO-s1(CTsr1)
SWan SWbn SWcn
SSa
SSb
POWER SUPPLY OUTPUT CONTROL CIRCUIT
POC
Wva1n
VDa1-sn(VDsrn)
Wva2n
VDa2-sn(VDsrn)
35
Wvbn
VDb-sn(VDsrn)
37-n
Wfen
FE-sn(CTsrn)
Wsan
Wnen
NE-sn(CTsrn)
Wsbn
Wbon
BO-sn(CTsrn)
30
Wbo
BO
DELAY CIRCUIT
dBO
Wbod
cp1
32 33 34

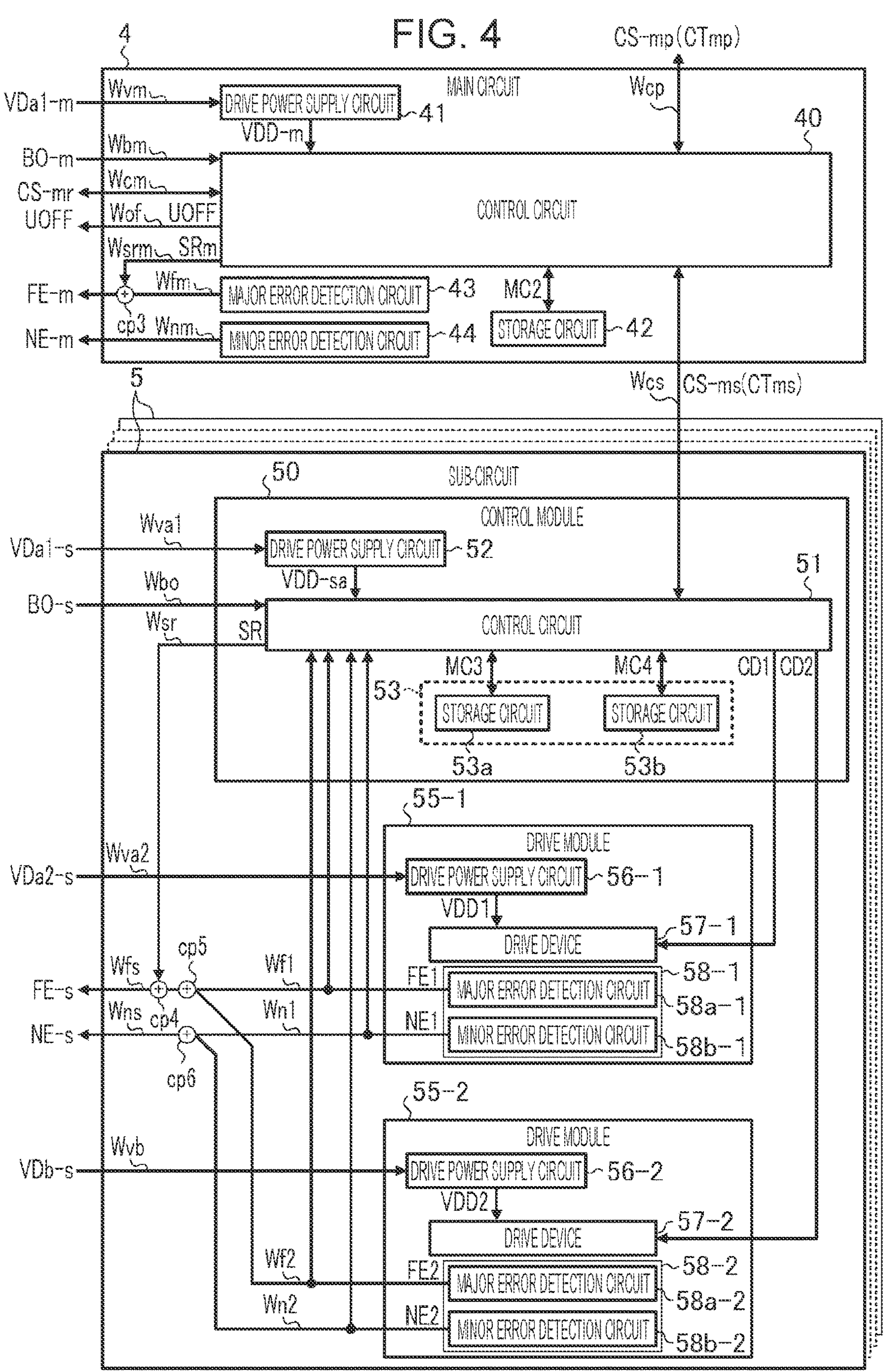
FIG. 4
4
CS-mp (CTmp)
MAIN CIRCUIT
Wvm
VDa1-m
DRIVE POWER SUPPLY CIRCUIT
41
Wcp
VDD-m
40
Wbm
BO-m
Wcm
CS-mr
CONTROL CIRCUIT
Wof
UOFF
UOFF
Wsrm
SRm
Wfm
FE-m
MAJOR ERROR DETECTION CIRCUIT
43
MC2
cp3
Wnm
STORAGE CIRCUIT
42
NE-m
MINOR ERROR DETECTION CIRCUIT
44
5
Wcs
CS-ms(CTms)
SUB-CIRCUIT
50
CONTROL MODULE
Wva1
VDa1-s
DRIVE POWER SUPPLY CIRCUIT
52
VDD-sa
51
Wbo
BO-s
Wsr
SR
CONTROL CIRCUIT
MC3
MC4
CD1
CD2
53
STORAGE CIRCUIT
STORAGE CIRCUIT
53a
53b
55-1
DRIVE MODULE
Wva2
VDa2-s
DRIVE POWER SUPPLY CIRCUIT
56-1
VDD1
DRIVE DEVICE
57-1
cp5
Wfs
Wf1
58-1
FE-s
FE1
MAJOR ERROR DETECTION CIRCUIT
58a-1
Wns
cp4
Wn1
NE-s
NE1
MINOR ERROR DETECTION CIRCUIT
58b-1
cp6
55-2
DRIVE MODULE
Wvb
VDb-s
DRIVE POWER SUPPLY CIRCUIT
56-2
VDD2
DRIVE DEVICE
57-2
Wf2
58-2
FE2
MAJOR ERROR DETECTION CIRCUIT
58a-2
Wn2
NE2
MINOR ERROR DETECTION CIRCUIT
58b-2

FIG. 5

| | | | | | | | |
|---|---|---|---|---|---|---|---|
| $M_g$-ne | Mne1 | Mne2 | Mne3 | ● ● ● ● ● ● | Mnei | ● ● ● ● | Mnen |
| | nes1 | nes2 | nes3 | ● ● ● ● ● ● | nesi | ● ● ● ● | nesn |
| $M_g$-fe | Mfe1 | Mfe2 | Mfe3 | ● ● ● ● ● ● | Mfei | ● ● ● ● | Mfen |
| | fes1 | fes2 | fes3 | ● ● ● ● ● ● | fesi | ● ● ● ● | fesn |

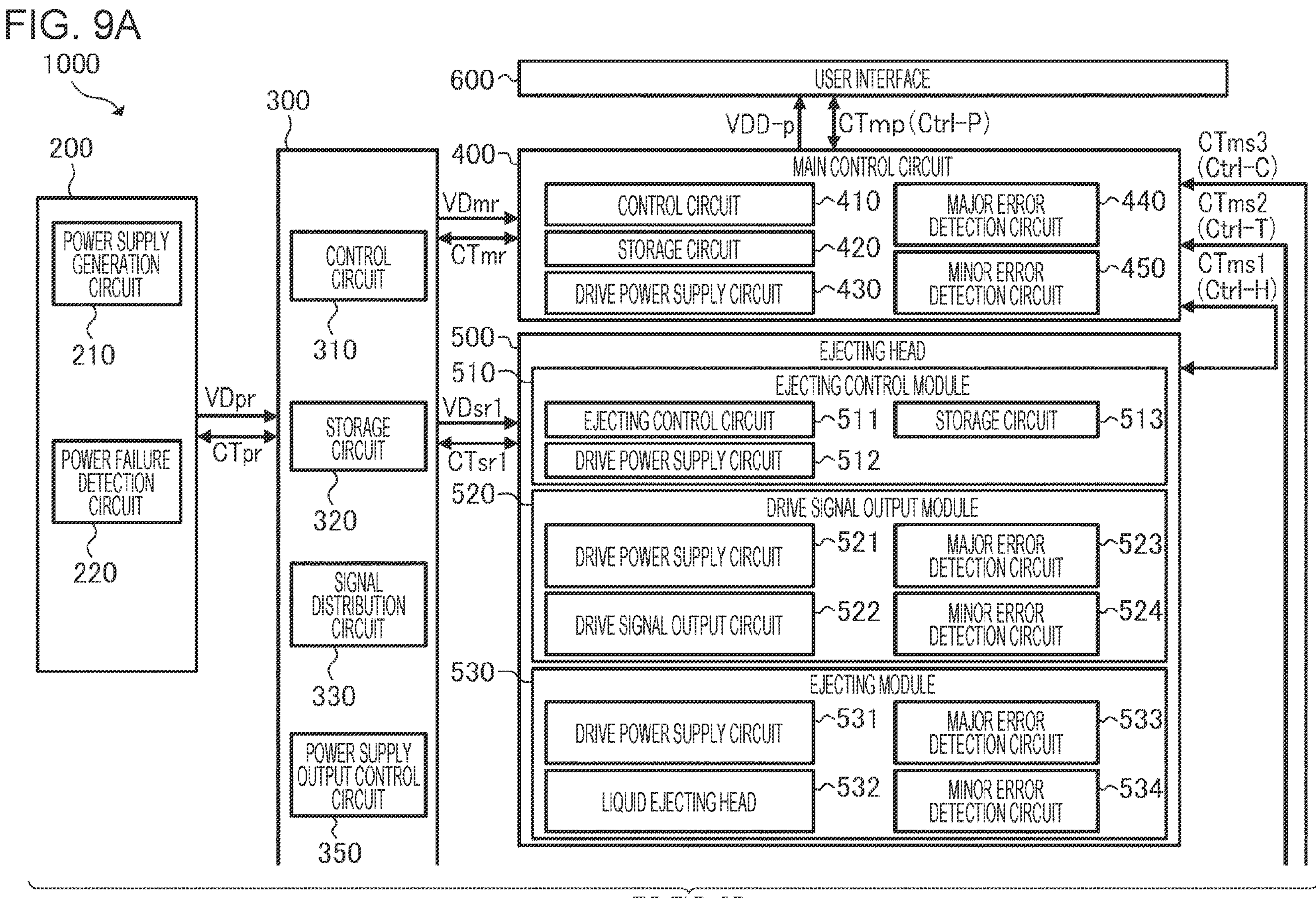
FIG. 9A
1000
200
POWER SUPPLY GENERATION CIRCUIT
210
POWER FAILURE DETECTION CIRCUIT
220
VDpr
CTpr
300
CONTROL CIRCUIT
310
STORAGE CIRCUIT
320
SIGNAL DISTRIBUTION CIRCUIT
330
POWER SUPPLY OUTPUT CONTROL CIRCUIT
350
600
USER INTERFACE
VDD-p
CTmp (Ctrl-P)
400
MAIN CONTROL CIRCUIT
VDmr
CTmr
CONTROL CIRCUIT
410
STORAGE CIRCUIT
420
DRIVE POWER SUPPLY CIRCUIT
430
MAJOR ERROR DETECTION CIRCUIT
440
MINOR ERROR DETECTION CIRCUIT
450
CTms3 (Ctrl-C)
CTms2 (Ctrl-T)
CTms1 (Ctrl-H)
500
EJECTING HEAD
510
EJECTING CONTROL MODULE
VDsr1
CTsr1
EJECTING CONTROL CIRCUIT
511
STORAGE CIRCUIT
513
DRIVE POWER SUPPLY CIRCUIT
512
520
DRIVE SIGNAL OUTPUT MODULE
DRIVE POWER SUPPLY CIRCUIT
521
MAJOR ERROR DETECTION CIRCUIT
523
DRIVE SIGNAL OUTPUT CIRCUIT
522
MINOR ERROR DETECTION CIRCUIT
524
530
EJECTING MODULE
DRIVE POWER SUPPLY CIRCUIT
531
MAJOR ERROR DETECTION CIRCUIT
533
LIQUID EJECTING HEAD
532
MINOR ERROR DETECTION CIRCUIT
534
TO FIG. 9B

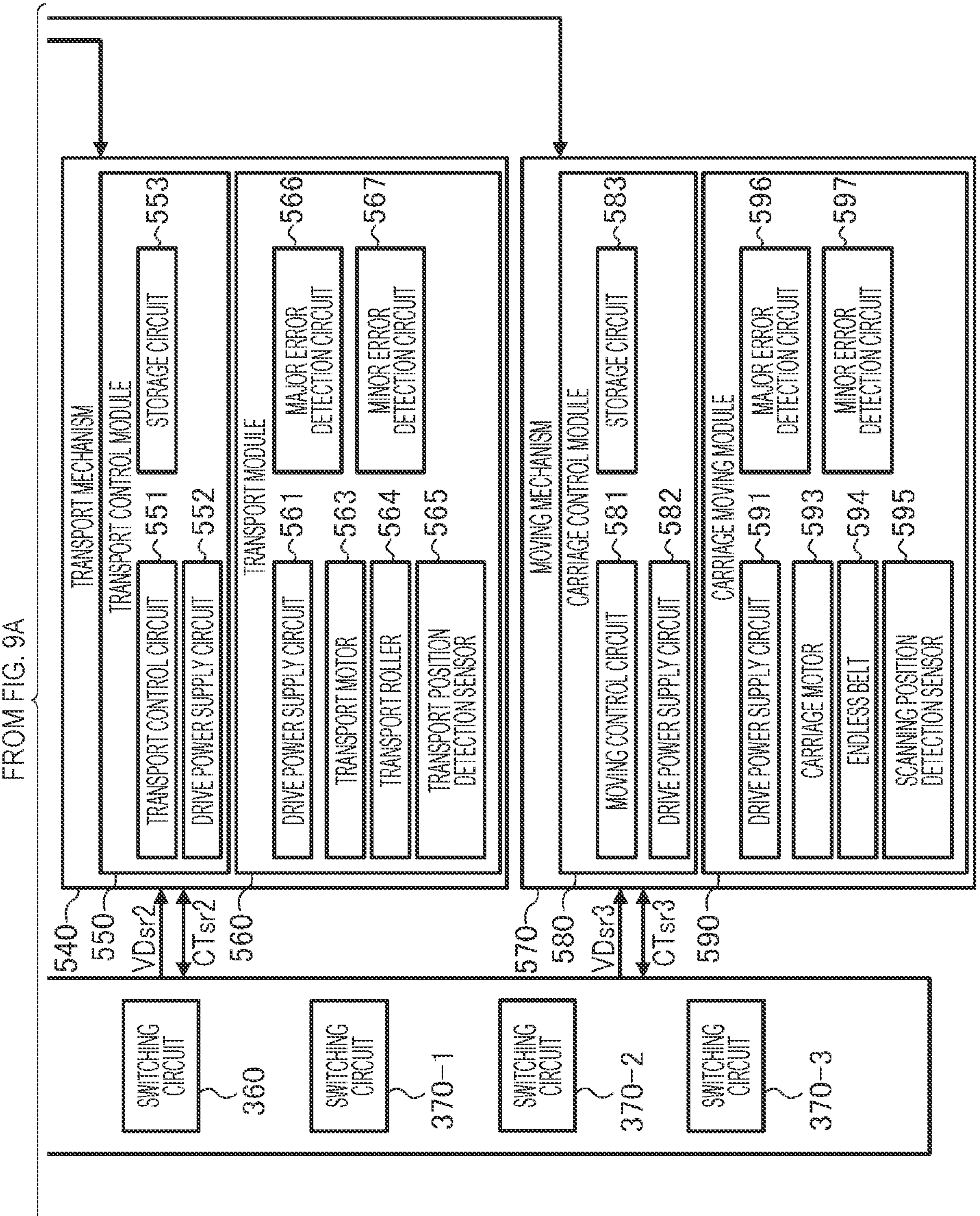
FIG. 9B
FROM FIG. 9A
TRANSPORT MECHANISM
TRANSPORT CONTROL MODULE
TRANSPORT CONTROL CIRCUIT
551
DRIVE POWER SUPPLY CIRCUIT
552
STORAGE CIRCUIT
553
TRANSPORT MODULE
DRIVE POWER SUPPLY CIRCUIT
561
TRANSPORT MOTOR
563
TRANSPORT ROLLER
564
TRANSPORT POSITION DETECTION SENSOR
565
MAJOR ERROR DETECTION CIRCUIT
566
MINOR ERROR DETECTION CIRCUIT
567
MOVING MECHANISM
CARRIAGE CONTROL MODULE
MOVING CONTROL CIRCUIT
581
DRIVE POWER SUPPLY CIRCUIT
582
STORAGE CIRCUIT
583
CARRIAGE MOVING MODULE
DRIVE POWER SUPPLY CIRCUIT
591
CARRIAGE MOTOR
593
ENDLESS BELT
594
SCANNING POSITION DETECTION SENSOR
595
MAJOR ERROR DETECTION CIRCUIT
596
MINOR ERROR DETECTION CIRCUIT
597
540
550
VDsr2
CTsr2
560
570
580
VDsr3
CTsr3
590
SWITCHING CIRCUIT
360
SWITCHING CIRCUIT
370-1
SWITCHING CIRCUIT
370-2
SWITCHING CIRCUIT
370-3

DISTRIBUTED CONTROL DEVICE AND DISTRIBUTED CONTROL SYSTEM

The present application is based on, and claims priority from JP Application Serial Number 2023-057912, filed Mar. 31, 2023, the disclosure of which is hereby incorporated by reference herein in its entirely.

BACKGROUND

1. Technical Field

The present disclosure relates to a distributed control device and a distributed control system.

2. Related Art

JP-A-2015-049731 discloses an image processing apparatus including a main board and a sub-board and performing distributed control. When a reset notification is input from a main board side to the sub-board, the sub-board stops power supply to bring the image processing apparatus into a reset state.

However, for the operation of the apparatus that performs the distributed control when the power supply is turned off, the technique described in JP-A-2015-049731 is not sufficient, and there is room for improvement.

SUMMARY

According to an aspect of the present disclosure, there is provided a distributed control device including a first power supply circuit to which a commercial power supply is input and which outputs a first power supply voltage, a power failure detection circuit that detects a voltage value of the commercial power supply and outputs a power failure notification signal according to whether or not the detected voltage value is lower than a predetermined threshold value, a first drive power supply circuit to which the first power supply voltage is supplied and that outputs a first drive voltage, a second drive power supply circuit to which the first power supply voltage is supplied and that outputs a second drive voltage, a control circuit that operates using the first drive voltage as a drive source, a first drive device that uses the second drive voltage as a drive source and operates under the control of the control circuit, a first propagation path propagating the first power supply voltage to the first drive power supply circuit, a second propagation path branching from the first propagation path and propagating the first power supply voltage to the second drive power supply circuit, and a first switching circuit that is provided in the second propagation path and switches whether or not to supply the first power supply voltage to the second drive power supply circuit. The power failure detection circuit detects a voltage value of the commercial power supply, and when the detected voltage value is lower than the predetermined threshold value, outputs the power failure notification signal including power failure information indicating that the commercial power supply is abnormal. The first switching circuit stops supply of the first power supply voltage to the second drive power supply circuit in accordance with a first switching control signal based on the power failure notification signal including the power failure information.

According to another aspect of the present disclosure, there is provided a distributed control system including a power supply terminal to which a commercial power supply is input and which outputs a first power supply voltage, a relay terminal that is electrically coupled to the power supply terminal, and a sub-terminal to which the first power supply voltage is supplied via the relay terminal. The power supply terminal includes a first power supply circuit to which the commercial power supply is input and which outputs the first power supply voltage, a power failure detection circuit that detects a voltage value of the commercial power supply and outputs a power failure notification signal according to whether or not the detected voltage value is lower than a predetermined threshold value. The sub-terminal includes a first drive power supply circuit to which the first power supply voltage is supplied and that outputs a first drive voltage, a second drive power supply circuit to which the first power supply voltage is supplied and that outputs a second drive voltage, a control circuit that operates using the first drive voltage as a drive source, and a first drive device that uses the second drive voltage as a drive source and operates under the control of the control circuit. The relay terminal includes a first switching circuit that switches whether or not to supply the first power supply voltage to the second drive power supply circuit. The first power supply voltage supplied to the first drive power supply circuit propagates through a first propagation path. The first power supply voltage supplied to the second drive power supply circuit branches from the first propagation path and propagates through a second propagation path. The first switching circuit is provided in the second propagation path. The power failure detection circuit detects a voltage value of the commercial power supply, and when the detected voltage value is lower than the predetermined threshold value, outputs the power failure notification signal including power failure information indicating that the commercial power supply is abnormal. The first switching circuit stops the supply of the first power supply voltage to the second drive power supply circuit in accordance with a first switching control signal based on the power failure notification signal including the power failure information.

BRIEF DESCRIPTION OF THE DRAWINGS

FIG. 3 is a view illustrating an example of a specific functional configuration of a relay circuit.

FIG. 4 is a view illustrating an example of a specific functional configuration of a main circuit and a sub-circuit.

FIG. 5 is a view illustrating an example of a configuration of a storage circuit.

FIGS. 9A and 9B are views illustrating a specific example of a functional configuration of the liquid ejecting apparatus that performs the distributed control.

DESCRIPTION OF EMBODIMENTS

Hereinafter, appropriate embodiments of the present disclosure will be described with reference to the drawings. The drawings to be used are provided for convenience of description. The embodiments to be described below do not inappropriately limit contents of the present disclosure described in the appended claims. In addition, all of configurations to be described below are not necessarily essential components of the present disclosure.

1. Distributed Control Device

1.1 Functional Configuration of Distributed Control Device

1.1.1 Overall Configuration of Distributed Control Device

A functional configuration of a distributed control device 1 according to the present embodiment will be described. In the distributed control device 1 of the present embodiment, one device is divided into a plurality of control units, each of the divided control units is independently operated, and a higher-ranking control unit achieves a mutual cooperation between the respective control units. The distributed control device 1 adopts the related configuration to reduce a possibility that a process load is concentrated on a specific configuration, even when the process load of the entire device increases due to an increase in a size of the device. As a result, a possibility that an unintended process delay occurs or a possibility that operational stability is lowered can be reduced.

Figure 1:
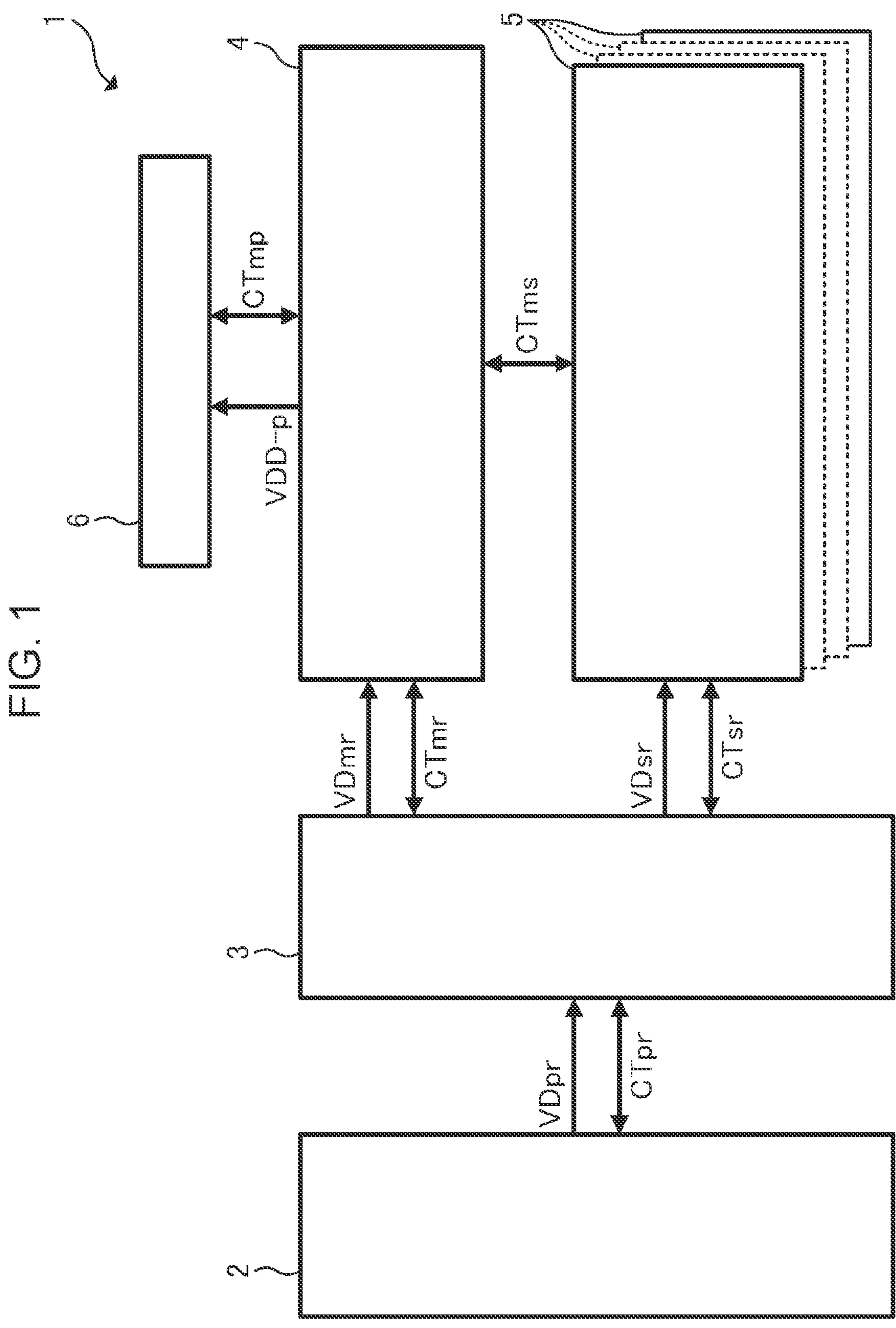
FIG. 1 is a view illustrating an example of a functional configuration of a distributed control device.

FIG. 1 is a view illustrating an example of the functional configuration of the distributed control device 1. As illustrated in FIG. 1, the distributed control device 1 includes a power supply circuit 2, a relay circuit 3, a main circuit 4, a plurality of sub-circuits 5, and a user interface 6.

The power supply circuit 2 generates and outputs a voltage signal VDpr which is a drive source of the distributed control device 1 from a commercial AC power supply supplied from an outside of the distributed control device 1. The voltage signal VDpr output by the power supply circuit 2 is supplied to the relay circuit 3. The relay circuit 3 distributes and outputs the supplied voltage signal VDpr to each of a main circuit 4 and the plurality of sub-circuits 5. A voltage signal VDmr out of signals to which the voltage signal VDpr is distributed by the relay circuit 3 is supplied to the main circuit 4. The main circuit 4 is operated by using the supplied voltage signal VDmr as a drive source. In addition, the main circuit 4 generates a voltage signal VDD-p based on the supplied voltage signal VDmr, and outputs the voltage signal VDD-p to the user interface 6. The user interface 6 is operated by using the voltage signal VDD-p supplied from the main circuit 4 as a drive source. In addition, a voltage signal VDsr out of the signals to which the voltage signal VDpr is distributed by the relay circuit 3 is supplied to each of the plurality of sub-circuits 5. Each of the plurality of sub-circuits 5 is operated by using the supplied voltage signal VDsr as a drive source.

In this case, the power supply circuit 2 and the relay circuit 3 are connected to be mutually communicable by a communication signal CTpr. In addition, the relay circuit 3 and the main circuit 4 are connected to be mutually communicable by a communication signal CTmr. The relay circuit 3 and each of the plurality of sub-circuits 5 are connected to be mutually communicable by a communication signal CTsr. The main circuit 4 and each of the plurality of sub-circuits 5 are connected to be mutually communicable by a communication signal CTms. In addition, the main circuit 4 and the user interface 6 are connected to be mutually communicable by a communication signal CTmp.

As described above, the distributed control device 1 of the present embodiment includes the power supply circuit 2 to which the commercial AC power supply is supplied and that outputs the voltage signal VDpr, the plurality of sub-circuits 5 to which the voltage signal VDsr based on the voltage signal VDpr is supplied, the main circuit 4 that controls operations of the plurality of sub-circuits 5 and the relay circuit 3, and the relay circuit 3 electrically coupled to the power supply circuit 2, the main circuit 4, and the plurality of sub-circuits 5. That is, in the distributed control device 1 of the present embodiment, each of the main circuit 4 and the plurality of sub-circuits 5 is driven by the voltage signal VDpr supplied via the relay circuit 3. Each of the relay circuit 3, the main circuit 4, and the plurality of sub-circuits 5 is independently operated by the supplied voltage signal VDpr. In this case, in the distributed control device 1, the power supply circuit 2, the relay circuit 3, the main circuit 4, the plurality of sub-circuits 5, and the user interface 6 are each connected to be communicable with each other by the corresponding communication signals CTpr, CTmr, CTsr, CTms, and CTmp. In this manner, a mutual cooperation is achieved among the power supply circuit 2, the relay circuit 3, the main circuit 4, the plurality of sub-circuits 5, and the user interface 6 which form the distributed control device 1. As a result, even when a process load of the entire device increases due to an increase in a size of the distributed control device 1, a possibility that the process load is concentrated on a specific configuration is reduced, and a possibility that an unintended process delay occurs or a possibility that operational stability is lowered is reduced.

Here, in the following description, when the plurality of sub-circuits 5 included in the distributed control device 1 are distinguished for description, the distributed control device 1 may have the n-number of sub-circuits 5, and the n-number of sub-circuits 5 may be referred to as sub-circuits 5-1 to 5-*n*. In this case, the voltage signal VDsr supplied to the sub-circuit 5-1 may be referred to as a voltage signal VDsr1, the communication signal CTsr propagated between the sub-circuit 5-1 and the relay circuit 3 may be referred to as a communication signal CTsr1, and the communication signal CTms propagated between the sub-circuit 5-1 and the main circuit 4 may be referred to as a communication signal CTms1. Similarly, the voltage signal VDsr supplied to the sub-circuit 5-*i* (i is 1 to n) may be referred to as a voltage signal VDsri, the communication signal CTsr propagated between the sub-circuit 5-*i* and the relay circuit 3 may be referred to as a communication signal Ctsri, and the communication signal CTms propagated between the sub-circuit 5-*i* and the main circuit 4 may be referred to as a communication signal CTmsi.

1.1.2 Functional Configuration of Power Supply Circuit

Figure 2:
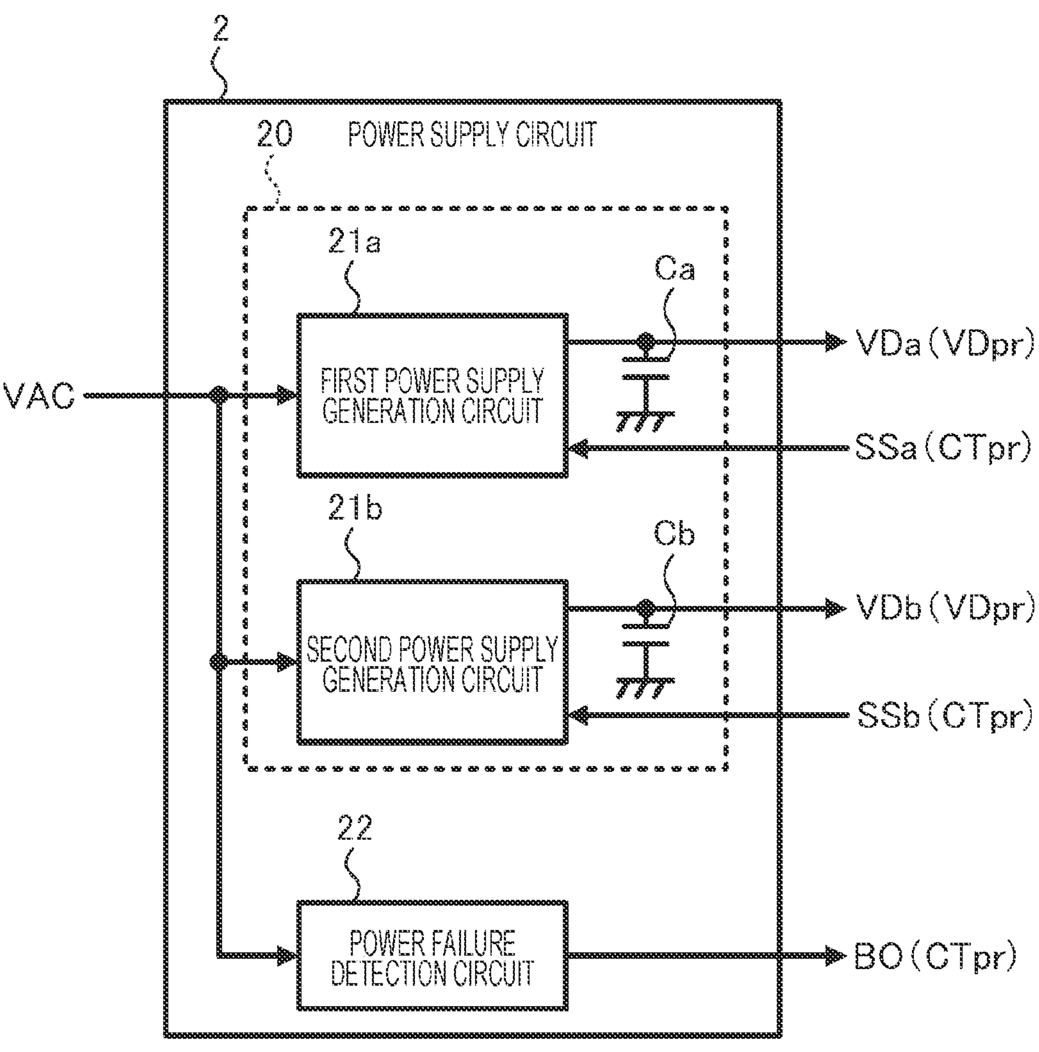
FIG. 2 is a view illustrating an example of a specific functional configuration of a power supply circuit.

Next, details of the functional configuration of this distributed control device 1 will be described. FIG. 2 is a view illustrating an example of a specific functional configuration of the power supply circuit 2. The power supply circuit 2 generates and outputs voltage signals VDa and VDb as the voltage signal VDpr which is the drive source of the distributed control device 1 from the voltage signal VAC as a commercial AC power supply supplied from the outside of the distributed control device 1.

The power supply circuit 2 includes a power supply generation circuit 20 and a power failure detection circuit 22. The power supply generation circuit 20 includes a first power supply generation circuit 21*a*, a second power supply generation circuit 21*b*, and capacitors Ca and Cb.

The voltage signal VAC is supplied to each of the first power supply generation circuit 21*a* and the second power supply generation circuit 21*b*. The first power supply generation circuit 21*a* generates and outputs the voltage signal VDa as a DC voltage as the voltage signal VDpr by performing AC/DC conversion on the supplied voltage signal VAC. Similarly, the second power supply generation circuit 21*b* generates and outputs the voltage signal VDb as the DC voltage as the voltage signal VDpr by performing the AC/DC conversion on the supplied voltage signal VAC.

One end of the capacitor Ca is electrically coupled to a propagation path propagating the voltage signal VDa output by the first power supply generation circuit 21*a*, and the ground potential is supplied to the other end. One end of the capacitor Cb is electrically coupled to a propagation path propagating the voltage signal VDb output by the second power supply generation circuit 21*b*, and the ground potential is supplied to the other end. These capacitors Ca and Cb reduce the possibility that the voltage values of the voltage signal VDa output by the first power supply generation circuit 21*a* and the voltage signal VDb output by the second power supply generation circuit 21*b* fluctuate, remove noise which may be superposed on the voltage signals VDa and VDb, and improve the accuracy of the voltage values of the voltage signals VDA and VDb.

As described above, the power supply circuit 2 and the power supply generation circuit 20 includes the first power supply generation circuit 21*a* to which the voltage signal VAC as a commercial power supply is input and which outputs the voltage signal VDa, the second power supply generation circuit 21*b* to which the voltage signal VAC as a commercial power supply is input and which outputs the voltage signal VDb different from the voltage signal VDa, and the capacitor Ca electrically coupled to a propagation path propagating the voltage signal VDa, and outputs the voltage signals VDa and VDb as the voltage signal VDpr.

In addition, an output control signal SSa is input to the first power supply generation circuit 21*a* as the communication signal CTpr. When the output control signal SSa to be input includes information requesting to stop outputting the voltage signal VDa, the first power supply generation circuit 21*a* stops outputting the voltage signal VDa, and when the output control signal SSa to be input does not include the information requesting to stop outputting the voltage signal VDa, the first power supply generation circuit 21*a* continues outputting the voltage signal VDa. That is, the output of the voltage signal VDa from the first power supply generation circuit 21*a* is controlled by the output control signal SSa.

Similarly, the output control signal SSb is input to the second power supply generation circuit 21*b* as the communication signal CTpr. When the output control signal SSb to be input includes the information for requesting to stop outputting the voltage signal VDb, the second power supply generation circuit 21*b* stops outputting the voltage signal VDb, and when the output control signal SSb to be input does not include the information requesting to stop outputting the voltage signal VDb, the second power supply generation circuit 21*b* continues outputting the voltage signal VDb. That is, the output of the voltage signal VDb from the second power supply generation circuit 21*b* is controlled by the output control signal SSb.

The power failure detection circuit 22 detects a voltage value of the voltage signal VAC which is the commercial AC power supply, and outputs a power failure notification signal BO corresponding to whether or not the detected voltage value is lower than a predetermined threshold value. That is, the power supply circuit 2 outputs the power failure notification signal BO corresponding to whether or not a voltage value of the voltage signal VAC is lower than a predetermined threshold value.

Specifically, the power failure detection circuit 22 detects an effective value of the voltage value of the voltage signal VAC supplied to the distributed control device 1. The power failure detection circuit 22 outputs a power failure notification signal BO whose logic level is changed depending on whether or not the effective value of the detected voltage signal VAC is lower than a predetermined voltage value. That is, the power supply circuit 2 has the power failure detection circuit 22 that detects the voltage value of the voltage signal VAC, and outputs the power failure notification signal BO having a predetermined logic level indicating that the voltage signal VAC is abnormal when the detected voltage value is lower than a predetermined threshold value. In other words, the power failure detection circuit 22 of the power supply circuit 2 detects the voltage value of the voltage signal VAC and outputs the power failure notification signal BO according to whether or not the detected voltage value is lower than the predetermined threshold value.

Here, for example, the predetermined threshold value in which the power failure detection circuit 22 determines whether or not the voltage value of the voltage signal VAC is abnormal can be set to 70% of a rated voltage value of the commercial AC power supply supplied to the distributed control device 1. That is, when the rated voltage value of the commercial AC power supply which is a drive voltage of the distributed control device 1 is 100 V, the power failure detection circuit 22 may determine that the effective value of the voltage signal VAC is 70 V or lower, and may output the power failure notification signal BO having a logic level indicating that the voltage value of the voltage signal VAC is abnormal. When the rated voltage value of the commercial AC power supply which is the drive voltage of the distributed control device 1 is 200 V, the power failure detection circuit 22 may determine that the effective value of the voltage signal VAC is 140 V or lower, and may output the power failure notification signal BO having a logic level indicating that the voltage value of the voltage signal VAC is abnormal. The predetermined threshold value by which the power failure detection circuit 22 determines whether or not the voltage value of the voltage signal VAC is abnormal is not limited to 70% of the rated voltage value, and may be any desired value corresponding to a usage environment and an operation state of the distributed control device 1. In addition, instead of or in addition to the effective value of the voltage signal VAC, the power failure detection circuit 22 may detect whether or not the voltage signal VAC is abnormal, based on an average value of the voltage value or a frequency of the voltage signal VAC.

1.1.3 Functional Configuration of Relay Circuit

Next, a specific functional configuration of the relay circuit 3 will be described. FIG. 3 is a view illustrating an example of the specific functional configuration of the relay circuit 3. The relay circuit 3 is electrically coupled to the power supply circuit 2, the main circuit 4, and the plurality of sub-circuits 5. In this manner, various signals supplied from each of the power supply circuit 2, the main circuit 4, and the plurality of sub-circuits 5 are relayed, the signals are propagated to a corresponding configuration, and the supply of various signals to the corresponding power supply circuit 2, the main circuit 4, and the plurality of sub-circuits 5 is controlled in accordance with a signal input from each of the power supply circuit 2, the main circuit 4, and the plurality of sub-circuits 5.

As illustrated in FIG. 3, the relay circuit 3 includes a control circuit 30, a storage circuit 31, a delay distribution circuit 32, a power supply output control circuit 35, and switching circuits 36 and 37-1 to 37-*n*. In addition, FIG. 3 simply illustrates a propagation wire that propagates various signals in the relay circuit 3.

The switching circuit 36 switches whether or not to supply each of the voltage signals VDa and VDb to the main circuit 4. Specifically, the switching circuit 36 includes switches SWam, SWbm, and SWcm. One end of the switch SWam is electrically coupled to the wire Wvda1 and the other end is electrically coupled to the wire Wvam. A conductive state between one end and the other end of the switch SWam is controlled by a signal input to a control end. One end of the switch SWbm is electrically coupled to the wire Wvda2 and the other end is in the open state. A conductive state between one end and the other end of the switch SWbm is controlled by a signal input to a control end. One end of the switch SWcm is electrically coupled to the wire Wvdb and the other end is in the open state. A conductive state between one end and the other end of the switch SWcm is controlled by a signal input to a control end.

The switching circuit 36 configured as described above supplies the voltage signal VDa propagating through the wire Wvda and the wire Wvda1 to the wire Wvam by switching the conductive state of the switch SWam by a signal input to the control end. That is, when the switch SWam is controlled to be conductive, the switching circuit 36 outputs the voltage signal VDa to the main circuit 4 as the voltage signal VDa1-m in the voltage signal VDmr, and when the switch SWam is controlled to be non-conductive, the switching circuit 36 stops the supply of the voltage signal VDa to the main circuit 4. In other words, the switching circuit 36 is provided in the propagation path of the voltage signals VDa and VDb supplied to the main circuit 4, and switches whether or not to supply the voltage signal VDa to the main circuit 4. In the present embodiment, description will be made on an assumption that the other ends of the switches SWbm and SWcm are all in an open state. However, the present disclosure is not limited thereto.

The switching circuits 37-1 to 37-*n* are provided corresponding to each of the plurality of sub-circuits 5.

The switching circuit 37-1 switches whether or not to supply each of the voltage signals VDa and VDb to the sub-circuit 5-1. Specifically, the switching circuit 37-1 includes switches SWa1, SWb1, and SWc1. One end of the switch SWa1 is electrically coupled to the wire Wvda1 and the other end is electrically coupled to the wire Wva11. A conductive state between one end and the other end of the switch SWa1 is controlled by a signal input to the control end. One end of the switch SWb1 is electrically coupled to the wire Wvda2 and the other end is electrically coupled to the wire Wva21. A conductive state between one end and the other end of the switch SWb1 is controlled by a signal input to the control end. One end of the switch SWc1 is electrically coupled to the wire Wvdb and the other end is electrically coupled to the wire Wvb1. A conductive state between one end and the other end of the switch SWc1 is controlled by a signal input to the control end.

In the switching circuit 37-1 configured as described above, each of the conductive states of the switches SWa1, SWb1, and SWc1 is switched by a signal input to the control end. In this manner, the switching circuit 37-1 switches whether or not to supply the voltage signal VDa propagating through the wire Wvda and the wire Wvda1 to the wire Wva11, whether or not to supply the voltage signal VDa propagating through the wire Wvda and the wire Wvda2 to the wire Wva21, and whether or not to supply the voltage signal VDb propagating through the wire Wvdb to the wire Wvb1. That is, when the switch SWa1 is controlled to be conductive, the switching circuit 37-1 outputs the voltage signal VDa to the sub-circuit 5-1 as the voltage signal VDa1-s1 in the voltage signal VDsr1. When the switch SWa1 is controlled to be non-conductive, the switching circuit 37-1 stops the supply of the voltage signal VDa to the sub-circuit 5-1 via the wire Wva11. When the switch SWb1 is controlled to be conductive, the switching circuit 37-1 outputs the voltage signal VDa to the sub-circuit 5-1 as the voltage signal VDa2-s1 in the voltage signal VDsr1. When the switch SWb1 is controlled to be non-conductive, the switching circuit 37-1 stops the supply of the voltage signal VDa to the sub-circuit 5-1 via the wire Wva21. When the switch SWc1 is controlled to be conductive, the switching circuit 37-1 outputs the voltage signal VDb to the sub-circuit 5-1 as the voltage signal VDb-s1 in the voltage signal VDsr1. When the switch SWc1 is controlled to be non-conductive, the switching circuit 37-1 stops the supply of the voltage signal VDb to the sub-circuit 5-1.

In other words, the switching circuit 37-1 is provided in the propagation path of the voltage signals VDa and VDb supplied to the sub-circuit 5-1, and switches whether or not to supply at least one of the voltage signals VDa and VDb in the voltage signal VDpr to the sub-circuit 5-1. Specifically, the switch SWa1 included in the switching circuit 37-1 is provided in a propagation path propagating the voltage signal VDa to be output as the voltage signal VDa1-s1, and switches whether or not to supply the voltage signal VDa1-s1 corresponding to the voltage signal VDa to the sub-circuit 5-1. The switch SWb1 included in the switching circuit 37-1 is provided in a propagation path propagating the voltage signal VDa to be output as the voltage signal VDa2-s1, and switches whether or not to supply the voltage signal VDa2-s1 corresponding to the voltage signal VDa to the sub-circuit 5-1. The switch SWc1 included in the switching circuit 37-1 is provided in a propagation path propagating the voltage signal VDb to be output as the voltage signal VDb-s1, and switches whether or not to supply the voltage signal VDb-s1 corresponding to the voltage signal VDb to the sub-circuit 5-1.

Similarly, the switching circuit 37-*i* (i is any one of 1 to n) switches whether or not to supply each of the voltage signals VDa and VDb to the sub-circuit 5-*i*. Specifically, the switching circuit 37-*i* includes switches SWai, SWbi, and SWci. One end of the switch SWai is electrically coupled to the wire Wvda1 and the other end is electrically coupled to the wire Wva1i. A conductive state between one end and the other end of the switch SWai is controlled by a signal input to the control end. One end of the switch SWbi is electrically coupled to the wire Wvda2 and the other end is electrically coupled to the wire Wva2i. A conductive state between one end and the other end of the switch SWbi is controlled by a signal input to the control end. One end of the switch SWci is electrically coupled to the wire Wvdb and the other end is electrically coupled to the wire Wvbi. A conductive state between one end and the other end of the switch SWci is controlled by a signal input to the control end.

In the switching circuit 37-*i* configured as described above, each conductive state of the switches SWai, SWbi, and SWci is switched by a signal input to the control end. In this manner, whether or not to supply the voltage signal VDa propagating through the wire Wvda and the wire Wvda1 to the wire Wva1i, whether or not to supply the voltage signal VDa2i propagating through the wire Wvda and the wire Wvda2 to the wire Wva2i, and whether or not to supply the voltage signal VDb propagating through the wire Wvdb to the wire Wvbi are switched. That is, when the switch SWai is controlled to be conductive, the switching circuit 37-*i* outputs the voltage signal VDa to the sub-circuit 5-*i* as the voltage signal VDa1-si in the voltage signal VDsri. When the switch SWai is controlled to be non-conductive, the switching circuit 37-*i* stops the supply of the voltage signal VDa to the sub-circuit 5-*i* via the wire Wva1i. When the switch SWbi is controlled to be conductive, the switching circuit 37-*i* outputs the voltage signal VDa to the sub-circuit 5-*i* as the voltage signal VDa2-si in the voltage signal VDsri. When the switch SWbi is controlled to be non-conductive, the switching circuit 37-*i* stops the supply of the voltage signal VDa to the sub-circuit 5-*i* via the wire Wva2i. When the switch SWci is controlled to be conductive, the switching circuit 37-*i* outputs the voltage signal VDb to the sub-circuit 5-*i* as the voltage signal VDb-si in the voltage signal VDsri. When the switch SWci is controlled to be non-conductive, the switching circuit 37-*i* stops the supply of the voltage signal VDb to the sub-circuit 5-*i*.

In other words, the switching circuit 37-*i* is provided in the propagation path of the voltage signals VDa and VDb supplied to the sub-circuit 5-*i*, and switches whether or not to supply at least one of the voltage signals VDa and VDb in the voltage signal VDpr to the sub-circuit 5-*i*. Specifically, the switch SWai included in the switching circuit 37-*i* is provided in a propagation path propagating the voltage signal VDa to be output as the voltage signal VDa1-si, and switches whether or not to supply the voltage signal VDa1-si corresponding to the voltage signal VDa to the sub-circuit 5-*i*. The switch SWbi included in the switching circuit 37-*i* is provided in a propagation path propagating the voltage signal VDa to be output as the voltage signal VDa2-si, and switches whether or not to supply the voltage signal VDa2-s1 corresponding to the voltage signal VDa to the sub-circuit 5-*i*. The switch SWci included in the switching circuit 37-*i* is provided in a propagation path propagating the voltage signal VDb to be output as the voltage signal VDb-si, and switches whether or not to supply the voltage signal VDb-si corresponding to the voltage signal VDb to the sub-circuit 5-*i*.

The delay distribution circuit 32 includes a delay circuit 33 and a distribution circuit 34. The delay distribution circuit 32 delays the input power failure notification signal BO for a predetermined period of time, and thereafter, distributes the power failure notification signal BO, and outputs the power failure notification signal BO as blocking process instruction signals BO-m and BO-si to BO-si.

The power failure notification signal BO is input to the delay circuit 33 via a wire Wbo. The delay circuit 33 delays the input power failure notification signal BO for a predetermined period of time, and thereafter, outputs the input power failure notification signal BO as a delay power failure notification signal dBO. This delay circuit 33 may be configured to include a latch circuit or a buffer circuit that holds the input power failure notification signal BO for a certain period of time and outputs the power failure notification signal BO at a predetermined timing, or may be configured to include a filter circuit such as a low-pass filter. In this manner, even when noise is superposed on the power failure notification signal BO, influence of the noise on the delay power failure notification signal dBO output by the delay circuit 33 can be reduced. Even when the voltage signal VAC is input to the distributed control device 1 and an instantaneous power failure or a short-time voltage drop occurs in the voltage signal VAC, influence of the instantaneous power failure or the voltage drop on the delay power failure notification signal dBO output by the delay circuit 33 can be reduced. As a result, reliability of the power failure notification signal BO and the delay power failure notification signal dBO can be improved.

The distribution circuit 34 distributes the delay power failure notification signal dBO output by the delay circuit 33, and outputs the delay power failure notification signal dBO to the main circuit 4 and the sub-circuits 5-1 to 5-*n*. Specifically, the delay power failure notification signal dBO output by the delay circuit 33 propagates through a wire Wbod, and is input to the distribution circuit 34. The wire Wbod propagating the delay power failure notification signal dBO is branched into a wire Wbom and wires Wbo1 to Wbon in the distribution circuit 34. That is, the delay power failure notification signal dBO propagating through the wire Wbod is distributed into the (n+1)-number of signals propagating through each of the wire Wbom and the wires Wbo1 to Wbon in the distribution circuit 34. Here, in the following description, in the delay power failure notification signal dBO, a signal propagating through the wire Wbom may be referred to as a blocking process instruction signal BO-m, a signal propagating through the wire Wbo1 may be referred to as a blocking process instruction signal BO-s1, and a signal propagating through the wire Wboi may be referred to as a blocking process instruction signal BO-si.

In addition, as illustrated in FIG. 3, the wire Wbom propagating the blocking process instruction signal BO-m is branched into a wire Wsbm in the relay circuit 3. The branched wire Wsbm is electrically coupled to the control end of the switches SWbm and SWcm included in the switching circuit 36. That is, a conductive state of the switches SWbm and SWcm included in the switching circuit 36 is controlled by the blocking process instruction signal BO-m. In addition, the wire Wbo1 propagating the blocking process instruction signal BO-s1 is branched into a wire Wsb1 in the relay circuit 3. The branched wire Wsb1 is electrically coupled to the control end of the switches SWb1 and SWc1 included in the switching circuit 37-1. That is, a conductive state of the switches SWb1 and SWc1 included in the switching circuit 37-1 is controlled by the blocking process instruction signal BO-s1. Similarly, the wire Wboi propagating the blocking process instruction signal BO-si is branched into a wire Wsbi in the relay circuit 3. The branched wire Wsbi is electrically coupled to control ends of the switches SWbi and SWci included in the switching circuit 37-*i*. That is, a conductive state of the switches SWbi and SWci included in the switching circuit 37-*i* is controlled by the blocking process instruction signal BO-si.

That is, the power failure notification signal BO output by the power failure detection circuit 22 is distributed in the relay circuit 3, is input to the main circuit 4 as the blocking process instruction signal BO-m, and is input to the switches SWbm and SWcm. Furthermore, the power failure notification signal BO is input to the sub-circuit 5-1 as the blocking process instruction signal BO-s1, and is input to the switches SWb1 and SWc1. Furthermore, the power failure notification signal BO is input to the sub-circuit 5-*i* as the blocking process instruction signal BO-si, and is input to the switches SWbi and SWci.

In addition, a stop request signal UOFF by which a user requests stopping an operation of the distributed control device 1 is input to the relay circuit 3. The stop request signal UOFF propagates through the wire Woff in the relay circuit 3, and is input to the distribution circuit 34. In this case, the wire Woff propagating the stop request signal UOFF is OR-coupled to the wire Wbod in the distribution circuit 34. In this manner, the stop request signal UOFF propagates through the wire Wbod, and is distributed into the (n+1)-number of signals propagating through each of the wire Wbom and the wires Wbo1 to Wbon in the distribution circuit 34. As a result, the stop request signal UOFF by which a user requests stopping the operation of the distributed control device 1 propagates through the wire Wbom, is input to the main circuit 4, propagates through the wires Wbom and Wsbm, and is input to each control end of the switches SWbm and SWcm. In addition, the stop request signal UOFF propagates through each of the wires Wbo1 to Wbon, is input to each of the sub-circuits 5-1 to 5-*i*, propagates through each of the wire Wbo1 to Wbon and the corresponding wires Wsb1 to Wsbn, and is input to each control end of the switches SWb1 to SWbn and SWc1 to SWcn. In this manner, a conductive state of the switches SWbm and SWcm included in the switching circuit 36 and a conductive state of each of the switches SWb1 to SWbn and SWc1 to SWcn included in the switching circuits 37-1 to 37-*n* are controlled by the stop request signal UOFF.

That is, the distribution circuit 34 distributes the input stop request signal UOFF, outputs the stop request signal UOFF to the main circuit 4 as the blocking process instruction signal BO-m, outputs the stop request signal UOFF to the sub-circuit 5-1 as the blocking process instruction signal BO-s1, and outputs the stop request signal UOFF to the sub-circuit 5-*i* as the blocking process instruction signal BO-si. In this case, a propagation path propagating the blocking process instruction signal BO-s1 based on the power failure notification signal BO supplied to the control circuit 51 (to be described later) included in the sub-circuit 5-1, and a propagation path propagating the blocking process instruction signal BO-s1 based on the stop request signal UOFF supplied to the control circuit 51 (to be described later) included in the sub-circuit 5-1 are electrically coupled at a coupling point cp1 of the distribution circuit 34. In this manner, the blocking process instruction signal BO-s1 based on the power failure notification signal BO and the blocking process instruction signal BO-s1 based on the stop request signal UOFF propagate through a common propagation path between the coupling point cp1 and the control circuit 51 (to be described later) included in the sub-circuit 5-1.

The control circuit 30 controls operations of various configurations of the relay circuit 3, based on the signal input from each of the power supply circuit 2, the main circuit 4, and the sub-circuits 5-1 to 5-*n*, and performs mutual communication with the main circuit 4 to achieve a mutual cooperation of various configurations in the distributed control device 1.

Specifically, as a communication signal CTmr, a major error signal FE-m propagating through a wire Wfem, and a minor error signal NE-m propagating through a wire Wnem are input to the control circuit 30. As each of communication signals CTsr1 to CTsrn, major error signals FE-s1 to FE-sn propagating through each of wires Wfel to Wfen and minor error signals NE-s1 to NE-sn propagating through each of wires Wne1 to Wnen are input to the control circuit 30. Based on each of the input major error signals FE-m and FE-s1 to FE-sn and the input minor error signals NE-m and NE-s1 to NE-sn, the control circuit 30 determines whether or not each operation of the main circuit 4 and the sub-circuits 5-1 to 5-*n* is normal, and holds a determination result.

In this case, the wire Wfem propagating the major error signal FE-m is branched into a wire Wsam in the relay circuit 3. The branched wire Wsam is electrically coupled to the control end of the switch SWam included in the switching circuit 36. That is, a conductive state of the switch SWam included in the switching circuit 36 is controlled by the major error signal FE-m. In other words, the switching circuit 36 receives an input of the major error signal FE-m, and switches whether or not to supply the voltage signal VDa as the voltage signal VDpr to the main circuit 4.

In addition, the wire Wfel propagating the major error signal FE-si is branched into a wire Wsa1 in the relay circuit 3. The branched wire Wsa1 is electrically coupled to the control end of the switch SWa1 included in the switching circuit 37-1. That is, a conductive state of the switch SWa1 included in the switching circuit 37-1 is controlled by the major error signal FE-s1. In other words, the switching circuit 37-1 receives an input of the major error signal FE-s1, and switches whether or not to supply the voltage signal VDa as the voltage signal VDsr1 to the sub-circuit 5-1.

Similarly, the wire Wfei propagating the major error signal FE-si is branched to a wire Wsai in the relay circuit 3. The branched wire Wsai is electrically coupled to the control end of the switch SWai included in the switching circuit 37-*i*. That is, a conductive state of the switch SWai included in the switching circuit 37-*i* is controlled by the major error signal FE-si. In other words, the switching circuit 37-*i* receives an input of the major error signal FE-si, and switches whether or not to supply the voltage signal VDa as the voltage signal VDsri to the sub-circuit 5-*i*.

In addition, as the communication signal CTmr, a control information signal CS-mr propagating through the wire Wcmr is input to the control circuit 30, and as the communication signal CTmr, the control circuit 30 outputs the control information signal CS-mr propagating through the wire Wcmr. The control information signal CS-mr functions as a signal for realizing mutual communication between the control circuit 30 and the main circuit 4. In this manner, various information can be mutually shared between the relay circuit 3 and the main circuit 4, and the mutual cooperation can be achieved.

In addition, the control circuit 30 outputs a memory control signal MC1 to the storage circuit 31. The storage circuit 31 includes at least one of a non-volatile memory and a volatile memory, and is controlled by the memory control signal MC1 output by the control circuit 30. Specifically, the control circuit 30 outputs the memory control signal MC1 for controlling writing predetermined information on the storage circuit 31. In this manner, the storage circuit 31 stores information corresponding to the input memory control signal MC1. In addition, the control circuit 30 outputs the memory control signal MC1 for reading the predetermined information held in the storage circuit 31. In this manner, information corresponding to the input memory control signal MC1 is read from the storage circuit 31. The storage circuit 31 outputs the memory control signal MC1 including the read information to the control circuit 30. In this manner, the control circuit 30 acquires information stored in the storage circuit 31. That is, the control circuit 30 uses the memory control signal MC1, and causes the storage circuit 31 to store a determination result regarding whether each operation of the main circuit 4 and the sub-circuits 5-1 to 5-*n* is normal, which is determined based on each of the major error signals FE-m and FE-s1 to FE-sn and the minor error signals NE-m and NE-s1 to NE-sn. The control circuit 30 uses the memory control signal MC1 to read the determination result from the storage circuit 31, and shares the determination result with the main circuit 4 by using the control information signal CS-mr.

In addition, the control circuit 30 outputs a power supply output control signal POC to the power supply output control circuit 35. The power supply output control circuit 35 outputs output control signals SSa and SSb corresponding to the input power supply output control signal POC. In this manner, the presence or absence of the output of the voltage signal VDa from the first power supply generation circuit 21*a* and the presence or absence of the output of the voltage signal VDb from the second power supply generation circuit 21*b* are controlled. That is, the control circuit 30 controls the output of the voltage signals VDa and VDb from the power supply generation circuit 20.

In addition, the control circuit 30 outputs a sleep request signal SLP. The sleep request signal SLP propagates through a wire Wslp. The wire Wslp is electrically coupled to a wire Woff at a coupling point cp2 in the relay circuit 3. In this case, the wire Wslp is OR-coupled to the wire Woff. In this manner, the sleep request signal SLP propagates through the wire Woff and the wire Wbod, and is distributed into the (n+1)-number of signals propagating through each of the wire Wbom and the wires Wbo1 to Wbon in the distribution circuit 34. As a result, the sleep request signal SLP propagates through the wire Wbom, is input to the main circuit 4, propagates through the wires Wbom and Wsbm, and is input to each control end of the switches SWbm and SWcm. Furthermore, the sleep request signal SLP propagates through each of the wires Wbo1 to Wbon, is input to the sub-circuits 5-1 to 5-*i*, propagate through each of the wires Wbo1 to Wbon and the corresponding wires Wsb1 to Wsbn, and is input to each control end of the switches SWb1 to SWbn and SWc1 to SWcn. That is, a conductive state of the switches SWbm and SWcm included in the switching circuit 36 and each conductive state of the switches SWb1 to SWbn and SWc1 to SWcn included in the switching circuits 37-1 to 37-*n* are also controlled by the sleep request signal SLP.

1.1.4 Functional Configurations of Main Circuit and Sub-Circuit

Next, specific functional configurations of the main circuit 4 and the sub-circuit 5 will be described. FIG. 4 is a view illustrating an example of the specific functional configurations of the main circuit 4 and the sub-circuit 5. Here, FIG. 4 simply illustrates a propagation wire propagating various signals in the main circuit 4 and the sub-circuit 5. The specific functional configurations of the plurality of sub-circuits 5 are the same, and in the following description, the specific functional configuration will be described by using one sub-circuit 5 as a representative example. In that case, description will be made on the following assumption. The sub-circuit 5 receives the inputs of the voltage signal VDa1-s as the voltage signals VDa1-s1 to VDa1-sn, the voltage signal VDa2-s as the voltage signals VDa2-s1 to VDa2-sn, the voltage signal VDb-s as the voltage signals VDb-s1 to VDb-sn, the blocking process instruction signal BO-s as the blocking process instruction signals BO-s1 to BO-sn, and the sub-circuit 5 outputs the major error signal FE-s as the major error signals FE-s1 to FE-sn and the minor error signal NE-s as the minor error signals NE-s1 to NE-sn.

As illustrated in FIG. 4, the main circuit 4 includes a control circuit 40, a drive power supply circuit 41, a storage circuit 42, a major error detection circuit 43, and a minor error detection circuit 44. The main circuit 4 is electrically coupled to the relay circuit 3, and controls the sub-circuits 5-1 to 5-*i* and the relay circuit 3.

The voltage signal VDa1-m is input to the drive power supply circuit 41. The drive power supply circuit 41 converts a voltage value of the input voltage signal VDa1-m into a voltage signal VDD-m, which is a DC voltage having a desired voltage value used in the main circuit 4, and outputs the voltage signal VDD-m to the control circuit 40. Any DC/DC converter can be used as this drive power supply circuit 41. In addition, the drive power supply circuit 41 generates the voltage signal VDD-p as a drive source of the user interface 6 illustrated in FIG. 1, based on the input voltage signal VDa1-m, and outputs the voltage signal VDD-p to the user interface 6. The voltage signal VDD-p input to the user interface 6 may be generated by any DC/DC converter different from the drive power supply circuit 41. That is, the main circuit 4 includes the drive power supply circuit 41 to which the voltage signal VDa1-m is supplied and which outputs the voltage signal VDD-m.

The major error detection circuit 43 detects whether or not the major abnormality occurs in the main circuit 4, generates and outputs the major error signal FE-m corresponding to the detection result. The major error signal FE-m output by the major error detection circuit 43 propagates through the wire Wfm, and is input to the relay circuit 3. That is, the major error signal FE-m output by the major error detection circuit 43 propagates through the wire Wfm of the main circuit 4 and the wire Wfem of the relay circuit 3, and is input to the control circuit 30 of the relay circuit 3. Here, the major abnormality detected by the major error detection circuit 43 is an abnormality in which the operation of the distributed control device 1 becomes unstable when the major abnormality occurs so that the supply of the power supply voltage to the distributed control device 1 needs to be blocked. The major abnormality includes an overvoltage abnormality of the voltage signal VDa1-m, an overcurrent abnormality of the current generated by the propagation of the voltage signal VDa1-m, and an excessive heat generation abnormality of the main circuit 4.

The minor error detection circuit 44 detects whether or not a minor abnormality occurs in the main circuit 4, and generates and outputs the minor error signal NE-m corresponding to the detection result. The minor error signal NE-m output by the minor error detection circuit 44 propagates through the wire Wnm, and is input to the relay circuit 3. That is, the minor error signal NE-m output by the minor error detection circuit 44 propagates through the wire Wnm of the main circuit 4 and the wire Wnem of the relay circuit 3, and is input to the control circuit 30 of the relay circuit 3. Here, the minor abnormality detected by the minor error detection circuit 44 is an abnormality occurring to such an extent that the supply of the power supply voltage to the distributed control device 1 does not need to be blocked even when the abnormality occurs. For example, the minor abnormality includes an abnormality in a detection value detected by a detection element such as a sensor of the main circuit 4, and a heat generation abnormality occurring to such an extent that safety of the main circuit 4 is not impaired.

The control circuit 40 is operated by using the voltage signal VDD-m output by the drive power supply circuit 41 as a drive source. The control circuit 40 controls each operation of the relay circuit 3, the sub-circuits 5-1 to 5-*n*, and the user interface 6, based on drive data (not illustrated) input from the outside of the distributed control device 1. The control circuit 40 controls operations of various configurations of the main circuit 4, based on signals input from each of the relay circuit 3, the sub-circuits 5-1 to 5-*n*, and the user interface 6, and performs mutual communication with the relay circuit 3, the sub-circuits 5-1 to 5-*n*, and the user interface 6 to achieve a mutual cooperation of various configurations in the distributed control device 1. That is, the control circuit 40 controls an operation of the control circuit 51 (to be described later) of the sub-circuit 5.

The control circuit 40 receives an input of the blocking process instruction signal BO-m, the control information signal CS-mr as the communication signal CTmr, the control information signal CS-mp as the communication signal CTmp, and the control information signal CS-ms as the communication signal CTms.

The control information signal CS-mr propagates through the wire Wcm, and is input to the control circuit 40. That is, the control information signal CS-mr output by the control circuit 30 of the relay circuit 3 propagates through the wire Wcmr of the relay circuit 3 and the wire Wcm of the main circuit 4, and is input to the control circuit 40. The control circuit 40 of the main circuit 4 and the control circuit 30 of the relay circuit 3 perform mutual communication by using the control information signal CS-mr. In this manner, the cooperation between the main circuit 4 and the relay circuit 3 is achieved. When the control information signal CS-mr is transmitted from the control circuit 40 of the main circuit 4 to the control circuit 30 of the relay circuit 3, and when the control information signal CS-mr is transmitted from the control circuit 30 of the relay circuit 3 to the control circuit 40 of the main circuit 4, the control information signal CS-mr may propagate through a common propagation path, or may propagate through a different propagation path. That is, the wire Wcm and the wire Wcmr are not limited to one propagation path.

The control information signal CS-mp propagates through the wire Wcp, and is input to the control circuit 40. In addition, the control circuit 40 outputs the control information signal CS-mp. The control information signal CS-mp output by the control circuit 40 is input to the user interface 6. That is, the control circuit 40 of the main circuit 4 and the user interface 6 perform mutual communication by using the control information signal CS-mp. In this manner, the cooperation between the main circuit 4 and the user interface 6 is achieved. When the control information signal CS-mp is transmitted from the control circuit 40 of the main circuit 4 to the user interface 6, and when the control information signal CS-mp is transmitted from the user interface 6 to the control circuit 40 of the main circuit 4, the control information signal CS-mp may propagate through a common propagation path, or may propagate through a different propagation path. That is, the wire Wcp is not limited to one propagation path.

The control information signal CS-ms propagates through the wire Wcs, and is input to the control circuit 40. In addition, the control circuit 40 outputs the control information signal CS-ms. The control information signal CS-ms output by the control circuit 40 is input to the control circuit 51 (to be described later) in the sub-circuit 5. That is, the control circuit 40 of the main circuit 4 and the control circuit 51 of the sub-circuit 5 perform mutual communication by using the control information signal CS-ms. In this manner, the cooperation between the main circuit 4 and the sub-circuit 5 is achieved. Here, the distributed control device 1 of the present embodiment has the n-number of sub-circuits 5. Therefore, the control circuit 40 of the main circuit 4 outputs the n-number of control information signals CS-ms corresponding to each of the n-number of sub-circuits 5, and the main circuit 4 and the n-number of sub-circuits 5 are electrically coupled by the n-number of wire Wcs. When the control information signal CS-ms is transmitted from the control circuit 40 of the main circuit 4 to the control circuit 51 of the sub-circuit 5, and when the control information signal CS-ms is transmitted from the control circuit 51 of the sub-circuit 5 to the control circuit 40 of the main circuit 4, the control information signal CS-ms may propagate through a common propagation path, or may propagate through a different propagation path. That is, the wire Wcs is not limited to one propagation path.

In addition, the blocking process instruction signal BO-m propagating through the wire Wbm is input to the control circuit 40. That is, the blocking process instruction signal BO-m output by the delay distribution circuit 32 of the relay circuit 3 propagates through the wire Wbom of the relay circuit 3 and the wire Wbm of the main circuit 4, and is input to the control circuit 40. The control circuit 40 determines whether or not a voltage value of the voltage signal VAC supplied to the distributed control device 1 is normal, based on the input blocking process instruction signal BO-m. When the control circuit 40 determines that the voltage value of the voltage signal VAC supplied to the distributed control device 1 is not normal, based on the blocking process instruction signal BO-m, the control circuit 40 performs a power supply blocking process for stopping an operation of the main circuit 4. Here, the power supply blocking process includes a stop process for stopping operations of the drive power supply circuit 41, the major error detection circuit 43, and the minor error detection circuit 44 which are included in the main circuit 4, and an information storing process for causing the storage circuit 42 to store operation information held by the control circuit 40.

The control circuit 40 outputs a memory control signal MC2 to the storage circuit 42. The storage circuit 42 includes at least one of a non-volatile memory and a volatile memory, and is controlled by the memory control signal MC2 output by the control circuit 40. Specifically, the control circuit 40 outputs the memory control signal MC2 for controlling writing predetermined information on the storage circuit 42. In this manner, the storage circuit 42 stores information corresponding to the input memory control signal MC2. In addition, the control circuit 40 outputs the memory control signal MC2 for reading predetermined information held in the storage circuit 42. In this manner, the storage circuit 42 reads information corresponding to the input memory control signal MC2, and outputs the memory control signal MC2 including the read information to the control circuit 40. In this manner, the control circuit 40 acquires the information stored in the storage circuit 42.

In addition, the control circuit 40 generates and outputs the stop request signal UOFF in accordance with a user's stop request input by an operation of the user interface 6. Specifically, when the user requests stopping the operation of the distributed control device 1 by operating the user interface 6, the user interface 6 generates the control information signal CS-mp including the stop request, and outputs the control information signal CS-mp to the control circuit 40. The control circuit 40 outputs the stop request signal UOFF requesting stopping of the operation of the distributed control device 1, based on the input control information signal CS-mp. The stop request signal UOFF output by the control circuit 40 propagates through the wire Wof, and is input to the relay circuit 3.

In addition, after the power supply blocking process is completed, the control circuit 40 outputs a supply stop signal SRm for stopping the supply of the voltage signal VDa-m to the main circuit 4 including the control circuit 40. The supply stop signal SRm output by the control circuit 40 propagates through a wire Wsrm. In this case, the wire Wsrm propagating the supply stop signal SRm is OR-coupled to the wire Wfm at a coupling point cp3. That is, both the supply stop signal SRm and the major error signal FE-m propagate through the wire Wfm.

The sub-circuit 5 includes a control module 50 and drive modules 55-1 and 55-2. In addition, the control module 50 includes a control circuit 51, a drive power supply circuit 52, and a storage circuit 53 including storage circuits 53*a* and 53*b*.

The voltage signal VDa1-s is input to the drive power supply circuit 52. The drive power supply circuit 52 converts the voltage value of the input voltage signal VDa1-s into the voltage signal VDD-sa as a DC voltage having a desired voltage value used in the control module 50, and outputs the voltage signal VDD-sa to the control circuit 51. Any DC/DC converter can be used as the drive power supply circuit 52. That is, the sub-circuit 5 include the drive power supply circuit 52 to which the voltage signal VDa1-s is supplied and which outputs the voltage signal VDD-sa.

The voltage signal VDD-sa generated based on the voltage signal VDa1-s corresponding to the voltage signal VDpr is supplied to the control circuit 51. The control circuit 51 is operated by using the supplied voltage signal VDD-sa as a drive source. In addition, a control information signal CS-ms output by the control circuit 40 of the main circuit 4 is input to the control circuit 51. The control circuit 51 generates and outputs a drive control signal CD1 for controlling an operation of the drive module 55-1 and a drive control signal CD2 for controlling an operation of the drive module 55-2, based on the input control information signal CS-ms.

In addition, the blocking process instruction signal BO-s propagating through the wire Wbo is input to the control circuit 51. That is, the blocking process instruction signal BO-s output by the delay distribution circuit 32 of the relay circuit 3 propagates through any of the wires Wbo1 to Wbon of the relay circuit 3 and the wire Wbo of the sub-circuit 5, and is input to the control circuit 51. The control circuit 51 determines whether or not a voltage value of the voltage signal VAC supplied to the distributed control device 1 is normal, based on the input blocking process instruction signal BO-s. When the control circuit 51 determines that the voltage value of the voltage signal VAC supplied to the distributed control device 1 is not normal, based on the blocking process instruction signal BO-s, the control circuit 51 performs the power supply blocking process for stopping an operation of the sub-circuit 5. Here, the power supply blocking process performed by the control circuit 51 includes a stop process for stopping operations of the control module 50 and the drive modules 55-1 and 55-2 which are included in the sub-circuit 5, and an information storing process for storing operation information held by the control circuit 51 in the storage circuit 53.

In addition, the control circuit 51 outputs a memory control signal MC3 to the storage circuit 53*a* included in the storage circuit 53. The storage circuit 53*a* is configured as a volatile memory, and is controlled by the memory control signal MC3 output by the control circuit 51. Specifically, the control circuit 51 outputs the memory control signal MC3 for controlling writing on predetermined information on the storage circuit 53*a*. In this manner, the storage circuit 53*a* stores information corresponding to the input memory control signal MC3. In addition, the control circuit 51 outputs the memory control signal MC3 for reading predetermined information held in the storage circuit 53*a*. In this manner, the storage circuit 53*a* reads information corresponding to the input memory control signal MC3, and outputs the memory control signal MC3 including the read information to the control circuit 51. In this manner, the control circuit 51 acquires the information stored in the storage circuit 53*a*.

In addition, the control circuit 51 outputs a memory control signal MC4 to the storage circuit 53*b* included in the storage circuit 53. The storage circuit 53*b* is configured as a non-volatile memory, and is controlled by the memory control signal MC4 output by the control circuit 51. Specifically, the control circuit 51 outputs the memory control signal MC4 for controlling writing predetermined information on the storage circuit 53*b*. In this manner, the storage circuit 53*b* stores information corresponding to the input memory control signal MC4. In addition, the control circuit 51 outputs the memory control signal MC4 for reading the predetermined information held in the storage circuit 53*b*. In this manner, the storage circuit 53*b* reads information corresponding to the input memory control signal MC4, and outputs the memory control signal MC4 including the read information to the control circuit 51. In this manner, the control circuit 51 acquires the information stored in the storage circuit 53*b*.

In addition, after the power supply blocking process is completed, the control circuit 51 outputs the supply stop signal SR for stopping the supply of the voltage signal VDa1-s to the control module 50 including the control circuit 51. The supply stop signal SR output by the control circuit 51 propagates through the wire Wsr. In addition, the wire Wsr is OR-coupled to a wire Wfs (to be described later) at a coupling point cp4. In this manner, the supply stop signal SR output by the control circuit 51 propagates through the wires Wsr and Wfs, and is input to the control circuit 30.

The drive module 55-1 includes a drive power supply circuit 56-1, a drive device 57-1, and an error detection circuit 58-1.

The voltage signal VDa2-s is input to the drive power supply circuit 56-1. The drive power supply circuit 56-1 converts the voltage value of the input voltage signal VDa2-s into the voltage signal VDD1 as a DC voltage having a desired voltage value used in the drive device 57-1, and outputs the voltage signal VDD1 to the drive device 57-1. Any DC/DC converter can be used as the drive power supply circuit 56-1. That is, the sub-circuit 5 includes the drive power supply circuit 56-1 to which the voltage signal VDa2-s is supplied and which outputs the voltage signal VDD1.

The drive device 57-1 is operated under the control of the drive control signal CD1 output by the control circuit 51 of the control module 50 by using the voltage signal VDD1 output by the drive power supply circuit 56-1 as a drive source. That is, the drive device 57-1 is operated by using the voltage signal VDD1 as the drive source under the control of the control circuit 51.

The error detection circuit 58-1 includes a major error detection circuit 58*a*-1 and a minor error detection circuit 58*b*-1. The error detection circuit 58-1 outputs a major error signal FE1 and a minor error signal NE1 as error signals indicating whether or not the abnormality occurs in the drive device 57-1.

The major error detection circuit 58*a*-1 detects whether or not a major abnormality occurs in the drive module 55-1 including the drive device 57-1, and generates and outputs the major error signal FE1 corresponding to the detection result. The major error signal FE1 output by the major error detection circuit 58*a*-1 propagates through a wire Wf1, is input to the relay circuit 3, is branched from the wire Wf1, and is also input to the control circuit 51. The control circuit 51 determines whether or not a major abnormality occurs in the drive module 55-1 including the drive device 57-1, based on the input major error signal FE1, and holds the determination result. Here, the major abnormality detected by the major error detection circuit 58*a*-1 is an abnormality in which the operation of the distributed control device 1 becomes unstable when the major abnormality occurs so that the supply of the power supply voltage to the distributed control device 1 needs to be blocked. The major abnormality includes an overvoltage abnormality of the voltage signal VDa2-s, an overcurrent abnormality of the current generated by the propagation of the voltage signal VDa2-s, and an excessive heat generation abnormality of the drive module 55-1.

The minor error detection circuit 58*b*-1 detects whether or not a minor abnormality occurs in the drive module 55-1 including the drive device 57-1, and generates and outputs the minor error signal NE1 corresponding to the detection result. The minor error signal NE1 output by the minor error detection circuit 58*b*-1 propagates through a wire Wn1, is input to the relay circuit 3, is branched from the wire Wn1, and is also input to the control circuit 51. The control circuit 51 determines whether or not a minor abnormality occurs in the drive module 55-1 including the drive device 57-1, based on the input minor error signal NE1, and holds the determination result. Here, the minor abnormality detected by the minor error detection circuit 58*b*-1 is an abnormality occurring to such an extent that the supply of the power supply voltage to the distributed control device 1 does not need to be blocked even when the abnormality occurs. For example, the abnormality includes an abnormality in a detection value detected by a detection element such as a sensor of the drive device 57-1, and a heat generation abnormality occurring to such an extent that safety of the drive module 55-1 is not impaired.

That is, the drive module 55-1 of the sub-circuit 5 includes the error detection circuit 58-1 that outputs an error signal including error information indicating whether or not an abnormality occurs in the drive device 57-1. The error detection circuit 58-1 includes the minor error detection circuit 58*b*-1 that outputs the minor error signal NE1 indicating whether or not a minor error which is a minor abnormality occurs in the drive device 57-1, and the major error detection circuit 58*a*-1 that outputs the major error signal FE1 indicating whether or not a major error which is a major abnormality greater than the minor error occurs in the drive device 57-1. That is, the error information indicating whether or not the abnormality occurs in the drive device 57-1, which is output by the error detection circuit 58-1, includes information indicating whether or not the minor error which is the minor abnormality occurs in the drive device 57-1, information indicating whether or not the major error which is the major abnormality greater than the minor error occurs in the drive device 57-1. The error signal indicating whether or not the abnormality occurs in the drive device 57-1, which is output by the error detection circuit 58-1, includes the minor error signal NE1 including information indicating that the minor error which is the minor abnormality occurs in the drive device 57-1, and the major error signal FE1 including information indicating that the major error which is the major abnormality occurs in the drive device 57-1.

The drive module 55-2 includes a drive power supply circuit 56-2, a drive device 57-2, and an error detection circuit 58-2.

The voltage signal VDb-s is input to the drive power supply circuit 56-2. The drive power supply circuit 56-2 converts the voltage value of the input voltage signal VDb-s into the voltage signal VDD2 as the DC voltage having a desired voltage value used in the drive device 57-2, and outputs the voltage signal VDD2 to the drive device 57-2. Any DC/DC converter can be used as the drive power supply circuit 56-2. That is, the sub-circuit 5 includes the drive power supply circuit 56-2 to which the voltage signal VDb-s is supplied and which outputs the voltage signal VDD2.

The drive device 57-2 is operated under the control of the drive control signal CD2 output by the control circuit 51 of the control module 50 by using the voltage signal VDD2 output by the drive power supply circuit 56-2 as a drive source. That is, the drive device 57-2 is operated by using the voltage signal VDD2 as the drive source under the control of the control circuit 51.

The error detection circuit 58-2 includes a major error detection circuit 58*a*-2 and a minor error detection circuit 58*b*-2. The error detection circuit 58-2 outputs the major error signal FE2 and the minor error signal NE2 as error signals indicating whether or not the abnormality occurs in the drive device 57-2.

The major error detection circuit 58*a*-2 detects whether or not the major abnormality occurs in the drive module 55-2 including the drive device 57-2, and generates and outputs the major error signal FE2 corresponding to the detection result. The major error signal FE2 output by the major error detection circuit 58*a*-2 propagates through a wire Wf2, is input to the relay circuit 3, is branched from the wire Wf2, and is also input to the control circuit 51. The control circuit 51 determines whether or not the major abnormality occurs in the drive module 55-2 including the drive device 57-2, based on the input major error signal FE2, and holds the determination result. Here, the major abnormality detected by the major error detection circuit 58*a*-2 is an abnormality in which the operation of the distributed control device 1 becomes unstable when the major abnormality occurs so that the supply of the power supply voltage to the distributed control device 1 needs to be blocked. The major abnormality includes an overvoltage abnormality of the voltage signal VDb-s, an overcurrent abnormality of the current generated by the propagation of the voltage signal VDb-s, and an excessive heat generation abnormality of the drive module 55-2.

The minor error detection circuit 58*b*-2 detects whether or not the minor abnormality occurs in the drive module 55-2 including the drive device 57-2, and generates and outputs the minor error signal NE2 corresponding to the detection result. The minor error signal NE2 output by the minor error detection circuit 58*b*-2 propagates through a wire Wn2, is input to the relay circuit 3, is branched from the wire Wn2, and is also input to the control circuit 51. The control circuit 51 determines whether or not the minor abnormality occurs in the drive module 55-2 including the drive device 57-2, based on the input minor error signal NE2, and holds the determination result. Here, the minor abnormality detected by the minor error detection circuit 58*b*-2 is an abnormality occurring to such an extent that the supply of the power supply voltage to the distributed control device 1 does not need to be blocked even when the abnormality occurs. For example, the abnormality includes an abnormality in a detection value detected by a detection element such as a sensor of the drive device 57-2, and a heat generation abnormality occurring to such an extent that safety of the drive module 55-2 is not impaired.

As described above, the drive module 55-2 of the sub-circuit 5 includes the error detection circuit 58-2 that outputs the error signal including the error information indicating whether or not the abnormality occurs in the drive device 57-2. The error detection circuit 58-2 includes the minor error detection circuit 58*b*-2 that outputs the minor error signal NE2 indicating whether or not the minor error which is the minor abnormality occurs in the drive device 57-2, and the major error detection circuit 58*a*-2 that outputs the major error signal FE2 indicating whether or not the major error which is the major abnormality greater major than the minor error occurs in the drive device 57-2. That is, the error information indicating whether or not the abnormality occurs in the drive device 57-2, which is output by the error detection circuit 58-2, includes information indicating whether or not the minor error which is the minor abnormality occurs in the drive device 57-2, information indicating whether or not the major error which the major abnormality greater than the minor error occurs in the drive device 57-2. The error signal indicating whether or not the abnormality occurs in the drive device 57-2, which is output by the error detection circuit 58-2, includes the minor error signal NE2 including information indicating that the minor error which is the minor abnormality occurs in the drive device 57-2, and the major error signal FE2 including information indicating that the major error which is the major abnormality occurs in the drive device 57-2.

Here, the wire Wf1 propagating the major error signal FE1 output by the major error detection circuit **58*a*-1 of the drive module 55-1 and the wire Wf2 propagating the major error signal FE2 output by the major error detection circuit 58*a*-2 of the drive module 55-2 are OR-coupled at a coupling point cp5, and thereafter, are electrically coupled to the relay circuit 3 as the common wire Wfs. In this case, the sub-circuit 5 outputs a signal corresponding to a logical sum of a logic level of the major error signal FE1 output by the major error detection circuit 58*a*-1 of the drive module 55-1 and a logic level of the major error signal FE2 output by the major error detection circuit 58*a*-2 of the drive module 55-2 to the relay circuit 3 as the major error signal FE-s. That is, each of the plurality of sub-circuits 5 generates the corresponding major error signals FE-si to FE-sn from the logical sum of the major error signal FE1 and the major error signal FE2. The major error signals FE-si to FE-sn generated by the plurality of sub-circuits 5 respectively propagate through the corresponding wire Wfs of the sub-circuit 5 and the corresponding wires Wfel to Wfen of the relay circuit 3, and are input to the control circuit 30**.

That is, the major error signal FE1 propagates through the wires Wf1 and Wfs and any of the wires Wfel to Wfen, and is input to the control circuit 30, and the major error signal FE2 propagates through any of the wires Wf2 and Wfs and the wires Wfe1 to Wfen, and is input to the control circuit 30. In this case, the major error signal FE-s which is the logical sum of the major error signal FE1 and the major error signal FE2 propagates through the wire Wfs and any of the wires Wfe1 to Wfen. In other words, the propagation path propagating the major error signal FE1 and the propagation path propagating the major error signal FE2 are electrically coupled at the coupling point cp5, and the major error signal FE1 and the major error signal FE2 propagate through the common propagation path between the coupling point cp5 and the control circuit 30.

In this case, in the wires Wf1, Wfs, and Wfe1 propagating the major error signal FE-s output by the sub-circuit 5-1, the wire Wfe1 is electrically coupled to the control end of the switch SWa1 by the wire Wsa1 branched in the relay circuit 3. That is, the wire Wf2 which is a portion of the propagation path propagating the major error signal FE2 output by the sub-circuit 5-1 is electrically coupled to the wires Wf1, Wfs, and Wfe1 at the coupling point cp5 which is closer to the major error detection circuit **58*a*-1 than the wire Wsa1, along the propagation path propagating the major error signal FE1 output by the sub-circuit 5-1**.

In addition, as described above, the supply stop signal SR output by the control circuit 51 is electrically coupled to the wire Wfs at the coupling point cp4. That is, the supply stop signal SR propagates through the wires Wsr and Wfs and any of the wires Wfel to Wfen, and is input to the control circuit 30. In other words, the propagation path propagating the supply stop signal SR and the propagation path propagating the major error signal FE1 are electrically coupled at the coupling point cp4, and the major error signal FE1 and the supply stop signal SR propagate through the common propagation path between the coupling point cp4 and the control circuit 30.

In addition, the wire Wn1 propagating the minor error signal NE1 output by the minor error detection circuit **58*b*-1 of the drive module 55-1 and the wire Wn2 propagating the minor error signal NE2 output by the minor error detection circuit 58*b*-2 of the drive module 55-2 are OR-coupled at a coupling point cp6, and thereafter, are electrically coupled to the relay circuit 3 as the common wire Wns. In this case, the sub-circuit 5 outputs a signal corresponding to the logical sum of the logic level of the minor error signal NE1 output by the minor error detection circuit 58*b*-1 of the drive module 55-1 and the logic level of the minor error signal NE2 output by the minor error detection circuit 58*b*-2 of the drive module 55-2 to the relay circuit 3 as the minor error signal NE-s. That is, each of the plurality of sub-circuits 5 generates the corresponding minor error signals NE-s1 to NE-sn from the logical sum of the minor error signal NE1 and the minor error signal NE2. The minor error signals NE-s1 to NE-sn generated by the plurality of sub-circuits 5 respectively propagate through the corresponding wire Wns of the sub-circuit 5 and the corresponding wires Wne1 to Wnen of the relay circuit 3, and are input to the control circuit 30**.

That is, the minor error signal NE1 propagates through the wires Wn1 and Wns and any of the wires Wne1 to Wnen, and is input to the control circuit 30, and the minor error signal NE2 propagates through the wires Wn2 and Wns and any of the wires Wne1 to Wnen, and input to the control circuit 30. In this case, the minor error signal NE-s which is a logical sum of the minor error signal NE1 and the minor error signal NE2 propagates through the wire Wns and any of the wires Wne1 to Wnen. In other words, the propagation path propagating the minor error signal NE1 and the propagation path propagating the minor error signal NE2 are electrically coupled at the coupling point cp6, and the minor error signal NE1 and the minor error signal NE2 propagate through the common propagation path between the coupling point cp6 and the control circuit 30.

In this case, the propagation path propagating the minor error signal NE1 and the propagation path propagating the minor error signal NE2 are not electrically coupled to the propagation path propagating the major error signal FE1 and the propagation path propagating the major error signal FE2. That is, the minor error signals NE1 and NE2 propagate through the propagation path different from the propagation path propagating the major error signals FE1 and FE2, and are input to the control circuit 30.

The control circuit 30 receives the inputs of the minor error signal NE-s1 corresponding to the minor error signal NE1 and the minor error signal NE2 which are output by the sub-circuit 5-1, and the major error signal FE-s1 corresponding to the major error signal FE1 and the major error signal FE2. The control circuit 30 holds the logic level of the minor error signal NE-s1 corresponding to the logic level of the minor error signal NE1 output by the sub-circuit 5-1 and the logic level of the minor error signal NE2, and the logic level of the major error signal FE-s1 corresponding to the logic level of the major error signal FE1 and the logic level of the major error signal FE2.

Similarly, the control circuit 30 receives the inputs of the minor error signals NE-s2 to NE-sn corresponding to the minor error signal NE1 and the minor error signal NE2 and the major error signals FE-s2 to FE-sn corresponding to the major error signal FE1 and the major error signal FE2 which are output by each of the sub-circuits 5-2 to 5-*n*. The control circuit 30 holds the logic levels of the minor error signals NE-s2 to NE-sn corresponding to the logic level of the minor error signal NE1 and the logic level of the minor error signal NE2 and the logic levels of the major error signals FE-s2 to FE-sn corresponding to the logic level of the major error signal FE1 and the logic level of the major error signal FE2 which are output by each of the sub-circuits 5-2 to 5-*n*.

1.1.5 Configuration of Storage Region of Storage Circuit 31

Here, a specific example of a storage region for storing the logic levels of the minor error signals NE-s1 to NE-sn and the logic levels of the major error signals FE-s1 to FE-sn which are held by the control circuit 30 will be described.

FIG. 5 is a view illustrating an example of a configuration of the storage circuit 31 for storing the logic levels of the minor error signals NE-s1 to NE-sn and the logic levels of the major error signals FE-s1 to FE-sn. As illustrated in FIG. 5, the storage circuit 31 includes a minor abnormality information storage region Mg-ne for storing whether or not the minor abnormality occurs in each of the sub-circuits 5-1 to 5-*n*, and a major abnormality information storage region Mg-fe for storing whether or not the major abnormality occurs in each of the sub-circuits 5-1 to 5-*n*.

The minor abnormality information storage region Mg-ne includes storage regions Mne1 to Mnen. Each of the storage regions Mne1 to Mnen stores each logic level of the minor error signals NE-s1 to NE-sn input to the control circuit 30, as information indicating whether or not the minor abnormality occurs in each of the sub-circuits 5-1 to 5-*n*. Specifically, the control circuit 30 holds the logic level of the minor error signal NE-s1 input from the sub-circuit 5-1 as abnormality information nes1, and stores information of "1" or "0" corresponding to the logic level of the held minor error signal NE-s1 in the storage region Mne1. In addition, the control circuit 30 holds the logic level of the minor error signal NE-si input from the sub-circuit 5-*i* as abnormality information nesi, and stores information of "1" or "0" corresponding to the logic level of the held minor error signal NE-si in the storage region Mnei.

Similarly, the major abnormality information storage region Mg-fe includes storage regions Mfe1 to Mfen. Each of the storage regions Mfe1 to Mfen stores each logic level of major error signals FE-si to FE-sn input to the control circuit 30, as the information indicating whether the major abnormality occurs in each of the sub-circuits 5-1 to 5-*n*. Specifically, the control circuit 30 holds the logic level of the major error signal FE-s1 input from the sub-circuit 5-1 as abnormality information fes1, and stores the information of "1" or "$_0$" corresponding to the logic level of the held major error signal FE-s1 in the storage region Mfe1. In addition, the control circuit 30 holds the logic level of the major error signal FE-si input from the sub-circuit 5-*i* as abnormality information fes1, and stores the information of "1" or "0" corresponding to the logic level of the held major error signal FE-si in the storage region Mfei.

That is, the storage circuit 31 of the relay circuit 3 includes the storage region Mne1 and the storage region MFe1 different from the storage region Mne1. The logic level of the minor error signal NE-s1 is stored in the storage region Mne1, and the logic level of the major error signal FE-s1 is stored in the storage region Mfe1. In addition, the storage circuit 31 includes the storage region Mnei and the storage region Mfei different from the storage region Mnei. The logic level of the minor error signal NE-si is stored in the storage region Mnei, and the logic level of the major error signal FE-si is stored in the storage region Mfei.

Here, in the following description, description will be made on the following assumption. In the storage regions Mne1 to Mnen of the minor abnormality information storage region Mg-ne, the information of "1" is stored corresponding to the minor error signal NE-si in a H-level, and the information of "$_0$" is stored corresponding to the minor error signal NE-si in a L-level. Similarly, in the storage regions Mfe1 to Mfen of the major abnormality information storage region Mg-fe, the information of "1" is stored corresponding to the major error signal FE-si in the H-level, and the information of "$_0$" is stored corresponding to the major error signal FE-si in the L-level.

1.2 Operation of Distributed Control Device

Here, as in the distributed control device 1 of the present embodiment, one device is divided into a plurality of control units, each of the plurality of divided control units is independently operated, and a higher-ranking control unit in the plurality of divided control units achieves a mutual cooperation between the respective control units. In the device that performs so-called distributed control in this way, even when a process load of the entire device increases due to an increase in a size of the device, a possibility that the process load is concentrated on a specific configuration can be reduced. In this manner, a possibility of a delay in a process time during an operation period of the device is reduced, and as a result, a possibility that operational stability of the device performing the distributed control is lowered is reduced.

Meanwhile, when the device performing the distributed control performs a stop process for stopping the operation, the higher-ranking control unit instructs each of the individual control units to individually perform a power supply blocking process. The higher-ranking control unit individually acquires a performance status of the power supply blocking process for each control unit. Therefore, there is a problem that a process time required for performing the stop process is lengthened. In particular, when the operation of the device is stopped since a voltage value of the commercial AC voltage input to the device performing the distributed control is blocked or lowered, the commercial AC voltage is blocked. Therefore, the stop process needs to be performed by using a residual electric charge stored in the device, and the stop process needs to be completed with small power consumption in a short time.

Compared to the related problem, the distributed control device 1 of the present embodiment includes the above-described configuration, and performs the stop process of the distributed control device 1 by using a characteristic procedure. In this manner, a time required for performing the stop process of the distributed control device 1 is shortened. Furthermore, even when the voltage value of the commercial AC voltage supplied to the distributed control device 1 is blocked or lowered, a possibility that the operation of the distributed control device 1 becomes unstable is reduced.

Here, a relationship between the logic levels of various signals used in the distributed control device 1 in the following description and the operation of the distributed control device 1 will be described. In the distributed control device 1 of the present embodiment, description will be made on the following assumption. When the voltage value of the input voltage signal VAC is equal to or greater than a predetermined threshold value, the power failure notification signal BO is set to a H-level, and when the voltage value of the input voltage signal VAC is smaller than the predetermined threshold value, the power failure notification signal BO is set to a L-level. In addition, description will be made on the following assumption. The major error signals FE-m, FE-s1 to FE-sn, FE1, and FE2 are set to the H-level when the major abnormality is detected, and are set to the L-level when the major abnormality is not detected. The minor error signals NE-m, NE-s1 to NE-sn, NE1, and NE2 are set to the H-level when the minor abnormality is detected, and are set to the L-level when the minor abnormality is not detected. In addition, description will be made on the following assumption. The stop request signal UOFF is set to the H-level when there is no stop request from a user, and is set to the L-level when there is a stop request from the user. In addition, description will be made on the following assumption. The supply stop signals SRm and SR are set to the L-level when the supply of the voltage signal VDa1 to the corresponding configuration is not stopped, and is set to the H-level when the supply of the voltage signal VDa1 to the corresponding configuration is stopped. In addition, description will be made on the following assumption. Each of the first power supply generation circuit 21*a* and the second power supply generation circuit 21*b* can output the corresponding voltage signals VDa and VDb when each of the output control signals SSa and SSb input corresponding thereto is in the L-level, and stops the output of the corresponding voltage signals VDa and VDb when each of the output control signals SSa and SSb input corresponding thereto is in the H-level. In addition, description will be made on the following assumption. When a signal in the L-level is input to the control end of each of the switches SWam and SWa1 to SWan included in each of the switching circuits 36 and 37-1 to 37-*n*, one end and the other end become conductive. When a signal in the H-level is input to the control end, one end and the other end become non-conductive. When a signal in the H-level is input to the control end of each of the switches SWbm, SWb1 to SWbn, SWcm, and SWc1 to SWcn included in each of the switching circuits 36 and 37-1 to 37-*n*, one end and the other end become conductive. When a signal in the L-level is input to the control end, one end and the other end become non-conductive. A relationship between the logic level of each signal in the distributed control device 1 and the operations of various circuits in accordance with the logic level of the signal is an example, and the present disclosure is not limited thereto.

1.2.1 Stop Process at User's Request

Figure 6:
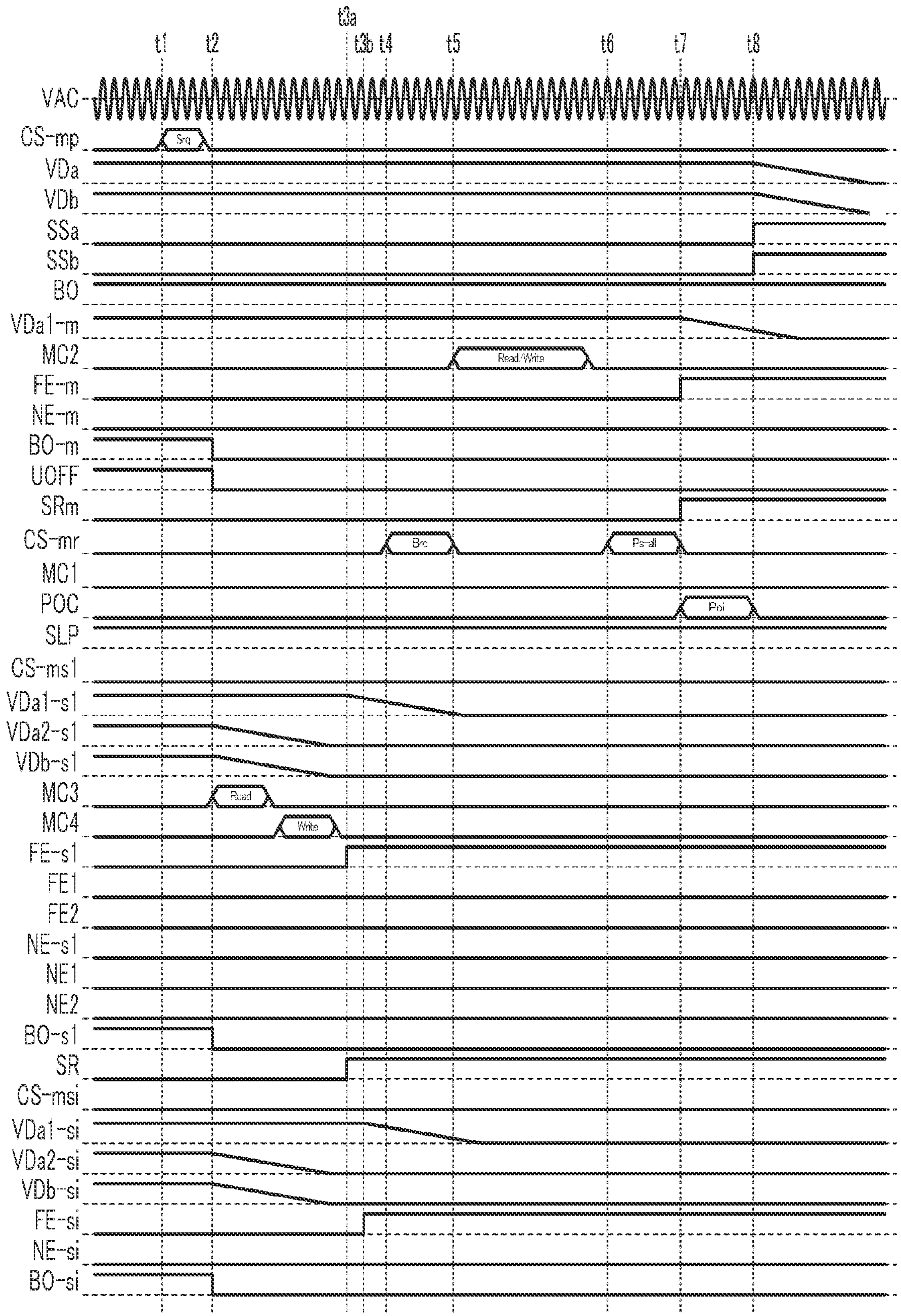
FIG. 6 is a view illustrating an example of a stop process of the distributed control device which is performed at a user's request.

First, an example of the stop process of the distributed control device 1 at a user's request will be described. FIG. 6 is a view illustrating an example of the stop process of the distributed control device 1 which is performed at the user's request. As illustrated in FIG. 6, before time t1, the distributed control device 1 is normally operated. At time t1, when the user's request for blocking the voltage signal VDpr is input to the user interface 6, the user interface 6 outputs the control information signal CS-mp including blocking request information Srq to the control circuit 40. The control circuit 40 analyzes the blocking request information Srq included in the input control information signal CS-mp. Based on a result of the analysis, at time t2 after the control circuit 40 determines that the user requests the blocking of the voltage signal VDpr, the control circuit 40 outputs the stop request signal UOFF in the L-level to stop the operation of the distributed control device 1. The stop request signal UOFF in the L-level output by the control circuit 40 propagates through the wires Wof and Woff, and is input to the distribution circuit 34. The distribution circuit 34 distributes the input stop request signal UOFF in the L-level to the wires Wbom and Wbo1 to Wbon, and outputs the stop request signal UOFF as the blocking process instruction signals BO-m and BO-s1 to BO-sn. That is, the blocking process instruction signals BO-m and BO-s1 to BO-sn in the L-level are output from the distribution circuit 34.

The blocking process instruction signal BO-m in the L-level output from the distribution circuit 34 propagates through the wire Wbom and the wire Wbm, and is input to the control circuit 40. The control circuit 40 determines that there is the request for blocking the voltage signal VDpr. In addition, the blocking process instruction signal BO-m in the L-level output from the distribution circuit 34 propagates through the wire Wsbm branched from the wire Wbom, and is input to the control end of the switches SWbm and SWcm. As a result, one end and the other end of the switches SWbm and SWcm are controlled to be non-conductive.

In addition, the blocking process instruction signal BO-s1 in the L-level output from the distribution circuit 34 propagates through the wire Wbo1 and the wire Wbo of the sub-circuit 5-1, is input to the control circuit 51 of the sub-circuit 5-1, propagates through the wire Wsb1 branched from the wire Wbo1, and is input to the control end of the switches SWb1 and SWc1.

One end and the other end of the switches SWb1 and SWc1 become non-conductive when the blocking process instruction signal BO-s1 in the L-level is input to the control end. As a result, the supply of the voltage signals VDa2-s1 and VDb-s1 to the sub-circuit 5-1 is stopped.

The control circuit 51 of the sub-circuit 5-1 performs the power supply blocking process when the blocking process instruction signal BO-s1 in the L-level is input. Specifically, the control circuit 51 of the sub-circuit 5-1 outputs the memory control signal MC3 for reading information held in the storage circuit 53*a* which is a volatile memory, and acquires the information held in the storage circuit 53*a*. Thereafter, the control circuit 51 of the sub-circuit 5-1 outputs the memory control signal MC4 for storing the information acquired from the storage circuit 53*a* in the storage circuit 53*b* which is a non-volatile memory. In this manner, an operation state of the sub-circuit 5-1 is stored in the storage circuit 53*b* which is the non-volatile memory.

At time t3a at which the power supply blocking process is completed, the control circuit 51 of the sub-circuit 5-1 outputs the supply stop signal SR in the H-level for stopping the supply of the voltage signal VDa1-s1 to the control circuit 51 of the sub-circuit 5-1. The supply stop signal SR in the H-level output by the control circuit 51 of the sub-circuit 5-1 propagates through the wire Wsr, and is supplied to the wire Wfs. That is, the supply stop signal SR in the H-level output by the control circuit 51 of the sub-circuit 5-1 is output from the sub-circuit 5-1 as the major error signal FE-si in the H-level. The major error signal FE-s1 in the H-level based on the supply stop signal SR in the H-level propagates through the wire Wfs and the wire Wfel of the sub-circuit 5-1, is input to the control circuit 30, propagates through the wire Wsa1 branched from the wire Wfe1, and is input to the control end of the switch SWa1.

When the major error signal FE-s1 in the H-level is input, the control circuit 30 determines that the power supply blocking process in the sub-circuit 5-1 is completed, and holds the input major error signal FE-s1 in the H-level. In addition, when the major error signal FE-s1 in the H-level is input to the control end of the switch SWa1, one end and the other end become non-conductive. As a result, the supply of the voltage signal VDa1-s1 to the sub-circuit 5-1 is stopped.

Similarly, the blocking process instruction signal BO-si in the L-level output from the distribution circuit 34 propagates through the wire Wboi and the wire Wbo of the sub-circuit 5-*i*, is input to the control circuit 51 of the sub-circuit 5-*i*, propagates through the wire Wsbi branched from the wire Wboi, and is input to the control end of the switches SWbi and SWci.

One end and the other end of the switches SWbi and SWci become non-conductive when the blocking process instruction signal BO-si is input to the control end in the L-level. As a result, the supply of the voltage signals VDa2-si and VDb-si to the sub-circuit 5-*i* is stopped.

The control circuit 51 of the sub-circuit 5-*i* performs the power supply blocking process when the blocking process instruction signal BO-si in the L-level is input. In this manner, similar to the sub-circuit 5-1, the operation state of the sub-circuit 5-*i* is stored in the storage circuit 53*b* of the sub-circuit 5-*i* which is the non-volatile memory.

At time t3b at which the power supply blocking process is completed, the control circuit 51 of the sub-circuit 5-*i* output the supply stop signal SR in the H-level for stopping the supply of the voltage signal VDa1-si to the control circuit 51 of the sub-circuit 5-*i*. The supply stop signal SR in the H-level output by the control circuit 51 of the sub-circuit 5-*i* is output from the sub-circuit 5-*i* as the major error signal FE-si in the H-level. The major error signal FE-si in the H-level based on the supply stop signal SR in the H-level propagates through the wire Wfs and the wire Wfei of the sub-circuit 5-*i*, is input to the control circuit 30, propagates through the wire Wsai branched from the wire Wfei, and is input to the control end of the switch SWai.

When the major error signal FE-si in the H-level is input, the control circuit 30 determines that the power supply blocking process in the sub-circuit 5-*i* is completed, and holds the input major error signal FE-si in the H-level. In addition, when the major error signal FE-si in the H-level is input to the control end of the switch SWai, one end and the other end become non-conductive. As a result, the supply of the voltage signal VDa1-si to the sub-circuit 5-*i* is stopped.

As described above, the control circuit 30 acquires and holds the major error signals FE-s1 to FE-sn output by each of the sub-circuits 5-1 to 5-*n*. At time t4 at which all of the logic levels of the held major error signals FE-s1 to FE-sn are in the H-level, the control circuit 30 determines that the power supply blocking processes for all of the sub-circuits 5-1 to 5-*n* are completed, and outputs the control information signal CS-mr including blocking completion information Brc indicating that the power supply blocking processes for all of the sub-circuits 5-1 to 5-*n* are completed to the control circuit 40.

The control circuit 40 performs the power supply blocking process of the main circuit 4 at time t5 at which the control information signal CS-mr including the blocking completion information Brc is input. Specifically, the control circuit 40 outputs the memory control signal MC2 for reading the information held in the region of the volatile memory in the storage circuit 42. In this manner, the control circuit 40 acquires the information held in the volatile memory, and thereafter, outputs the memory control signal MC2 for storing the information acquired from the volatile memory in the non-volatile memory in the storage circuit 42. In this manner, the operation state of the main circuit 4 is stored in the non-volatile memory.

At time t6 at which the power supply blocking process is completed, the control circuit 40 generates the control information signal CS-mr including the stop request information Ps-all for stopping the outputs of the voltage signals VDa and VDb from each of the first power supply generation circuit 21*a* and the second power supply generation circuit 21*b*, and outputs the control information signal CS-mr to the control circuit 30.

In addition, at time t7 after the output of the control information signal CS-mr including the stop request information Ps-all is completed, the control circuit 40 outputs the supply stop signal SRm in the H-level for stopping the supply of the voltage signal VDa1-m to the control circuit 40. The supply stop signal SRm in the H-level output by the control circuit 40 propagates through the wire Wsrm, and is supplied to the wire Wfm. That is, the supply stop signal SRm in the H-level output by the control circuit 40 is output from the main circuit 4 as the major error signal FE-m in the H-level. The major error signal FE-m in the H-level based on the supply stop signal SRm in the H-level propagates through the wire Wfm and the wire Wfem of the main circuit 4, is input to the control circuit 30, propagates through the wire Wsam branched from the wire Wfem, and is input to the control end of the switch SWam. When the major error signal FE-m in the H-level is input to the control end of the switch SWam, one end and the other end become non-conductive. As a result, the supply of the voltage signal VDa1-m to the main circuit 4 is stopped.

In addition, at time t7, the control information signal CS-mr including the stop request information Ps-all is input to the control circuit 30. Based on the stop request information Ps-all included in the input control information signal CS-mr, the control circuit 30 generates the power supply output control signal POC including the power supply control information Poi for controlling all of the logic levels of the output control signals SSa and SSb to be the H-level, and outputs the power supply output control signal POC to the power supply output control circuit 35.

At time t8 at which the input of the power supply output control signal POC including the power supply control information Poi is completed, the power supply output control circuit 35 analyzes the power supply control information Poi included in the input power supply output control signal POC, and outputs the output control signal SSa in the H-level and the output control signal SSb in the H-level, based on an analysis result. As a result, the output of the voltage signal VDa from the first power supply generation circuit 21*a* and the output of the voltage signal VDb from the second power supply generation circuit 21*b* are stopped. In this manner, the stop process of the distributed control device 1 is completed.

As described above, in the distributed control device 1 of the present embodiment, when the control information signal CS-mp including the blocking request information Srq in which the user requests blocking the voltage signal VDpr including the voltage signals VDa and VDb is input to the control circuit 40 of the main circuit 4, the control circuit 40 outputs the stop request signal UOFF corresponding to the control information signal CS-mp including the blocking request information Srq. The stop request signal UOFF output by the control circuit 40 is input to the control circuit 51 of the sub-circuit 5-1 as the blocking process instruction signal BO-s1. The control circuit 51 of the sub-circuit 5-1 performs the power supply blocking process in accordance with the blocking process instruction signal BO-s1 based on the input stop request signal UOFF. After the power supply blocking process is completed, the control circuit 51 outputs the supply stop signal SR in the H-level. The switching circuit 37-1 as the switch Swa1 included in the switching circuit 37-1 stops the supply of the voltage signal VDa1-s1 to the control circuit 51 of the sub-circuit 5-1 in accordance with the major error signal FE-s1 in the H-level based on the supply stop signal SR in the H-level. That is, when the stop request signal UOFF in which the user request stopping the supply of the voltage signal VDpr including the voltage signals VDa and VDb is input to the relay circuit 3, the relay circuit 3 outputs the blocking process instruction signal BO-s1 to the sub-circuit 5-1, without depending on the logic level of the power failure notification signal BO, and outputs the blocking process instruction signal BO-si to the sub-circuit 5-*i*.

That is, in the distributed control device 1 of the present embodiment, the sub-circuit 5-1 performs the power supply blocking process, based on the stop request signal UOFF corresponding to the control information signal CS-mp including the blocking request information Srq output by the control circuit 40. After the power supply blocking process is completed, the sub-circuit 5-1 blocks the power supply to the sub-circuit 5-1. In other words, the sub-circuit 5 completes the power supply blocking process which is one of the stop processes without any engagement of the main circuit 4. In this manner, the sub-circuit 5 can complete the power supply blocking process which is one of the stop processes without waiting for an instruction from the main circuit 4. As a result, a time required for the stop process of the distributed control device 1 can be shortened.

Furthermore, in the distributed control device 1 of the present embodiment, the distributed control device 1 includes the sub-circuit 5-*i*, and the blocking process instruction signal BO-si based on the stop request signal UOFF is input to the control circuit 51 of the sub-circuit 5-*i*. The control circuit 51 of the sub-circuit 5-*i* outputs the supply stop signal SR in the H-level after the power supply blocking process is performed and the power supply blocking process is completed in accordance with the blocking process instruction signal BO-si based on the input stop request signal UOFF. The switching circuit 37-*i* as the switch SWai included in the switching circuit 37-*i* stops the supply of the voltage signal VDa1-si to the control circuit 51 of the sub-circuit 5-*i* in accordance with the major error signal FE-si in the H-level based on the supply stop signal SR in the H-level output by the control circuit 51 of the sub-circuit 5-*i*.

Here, the switch SWa1 included in the switching circuit 37-1 controls whether or not to supply the voltage signal VDa1-s1 to the control circuit 51 of the sub-circuit 5-1 in accordance with the logic level of the supply stop signal SR output by the control circuit 51 of the sub-circuit 5-1. The switch SWai included in the switching circuit 37-*i* controls whether or not to supply the voltage signal VDa1-si to the control circuit 51 of the sub-circuit 5-*i* in accordance with the logic level of the supply stop signal SR output by the control circuit 51 of the sub-circuit 5-*i*. That is, the logic level of the supply stop signal SR output by the control circuit 51 of the sub-circuit 5-1 corresponds to the information on whether or not the switching circuit 37-1 as the switch Swa1 included in the switching circuit 37-1 stops the supply of the voltage signal VDa1-s1 to the control circuit 51 of the sub-circuit 5-1, and the logic level of the supply stop signal SR output by the control circuit 51 of the sub-circuit 5-*i* corresponds to the information on whether or not the switching circuit 37-*i* as the switch Swai included in the switching circuit 37-*i* stops the supply of the voltage signal VDa1-si to the control circuit 51 of the sub-circuit 5-*i*.

The control circuit 30 of the relay circuit 3 holds the logic level of the major error signal FE-s1 corresponding to the supply stop signal SR output by the control circuit 51 of the sub-circuit 5-1, which is the information on whether or not the switch SWa1 included in the switching circuit 37-1 stops the supply of the voltage signal VDa1-s1 to the control circuit 51 of the sub-circuit 5-1, and the logic level of the major error signal FE-si corresponding to the supply stop signal SR output by the control circuit 51 of the sub-circuit 5-*i*, which is the information on whether or not the switch SWai included in the switching circuit 37-*i* stops the supply of the voltage signal VDa1-si to the control circuit 51 of the sub-circuit 5-*i*. The control circuit 40 of the main circuit 4 acquires the logic levels of the major error signals FE-si to FE-sn including the logic level of the major error signal FE-s1 and the logic level of the major error signal FE-si which are held by the control circuit 30 of the relay circuit 3, for example, the abnormality information fes1 to fesn stored in the major abnormality information storage region Mg-fe stored in the storage circuit 31. In this manner, the control circuit 40 specifies the sub-circuit 5 in which the power supply blocking process is completed, based on the abnormality information fes1 to fesn stored in the acquired major abnormality information storage region Mg-fe.

As described above, even when the distributed control device 1 includes the plurality of sub-circuits 5, each of the plurality of sub-circuits 5 can complete the power supply blocking process which is one of the stop processes without waiting for the instruction from the main circuit 4. In this manner, a time required for the stop process of the distributed control device 1 can be shortened. In addition, the information on whether or not the power supply blocking process which is one of the stop processes in each of the plurality of sub-circuits 5 is completed is held by the control circuit 30 of the relay circuit 3. Accordingly, the main circuit 4 can confirm a status of the power supply blocking process of the plurality of sub-circuits 5 only by acquiring the information held by the control circuit 30 of the relay circuit 3. In this manner, the main circuit 4 does not need to individually confirm the status of the power supply blocking process for the plurality of sub-circuits 5. As a result, a time required for the stop process of the distributed control device 1 can be further shortened.

1.2.2 Stop Process by Detecting Power Failure

Figure 7:
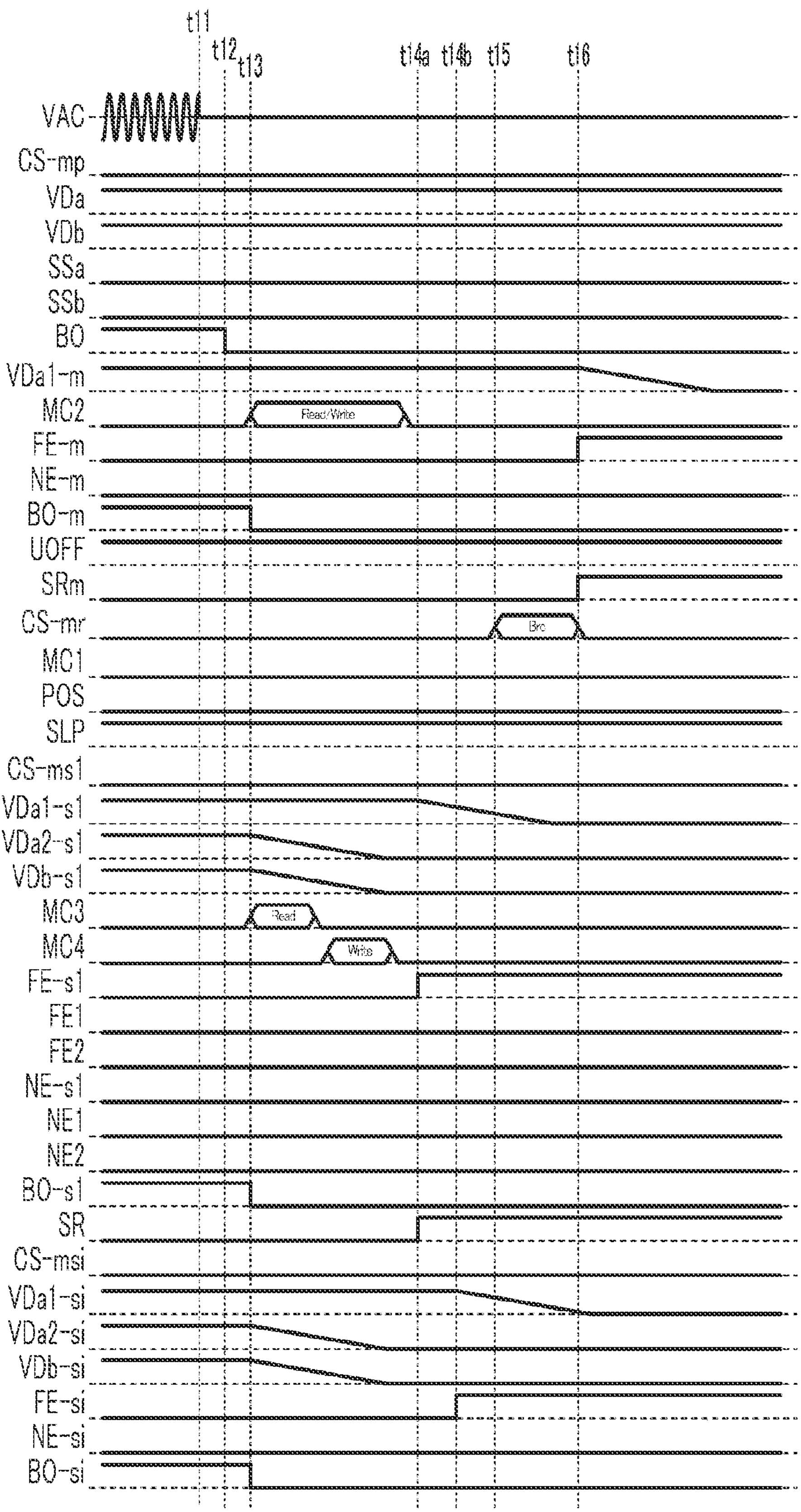
FIG. 7 is a view illustrating an example of a stop process of the distributed control device when a power failure is detected.

Next, an example of the stop process of the distributed control device 1 when the voltage value of the supplied voltage signal VAC is lowered will be described. FIG. 7 is a view illustrating an example of the stop process of the distributed control device 1 when the power failure is detected. As illustrated in FIG. 7, before time t11, the distributed control device 1 is normally operated. At time t11, the supply of the voltage signal VAC, which is the commercial AC power supply input to the distributed control device 1 is stopped. At time t12 at which the voltage value of the voltage signal VAC falls below a predetermined threshold value in a predetermined period after the supply of the voltage signal VAC is stopped, the power failure detection circuit 22 determines that the voltage signal VAC input to the distributed control device 1 is abnormal, and outputs the power failure notification signal BO in the L-level. The power failure notification signal BO output by the power failure detection circuit 22 is input to the delay distribution circuit 32. The delay distribution circuit 32 delays the input power failure notification signal BO in the L-level for a predetermined period of time, and thereafter, distributes the power failure notification signal BO to the wires Wbom and Wbo1 to Wbon. At time t13, the delay distribution circuit 32 outputs the power failure notification signal BO as the blocking process instruction signals in the L-level BO-m and BO-s1 to BO-sn.

The blocking process instruction signal BO-m in the L-level output by the delay distribution circuit 32 propagates through the wire Wbom and the wire Wbm, and is input to the control circuit 40. The control circuit 40 determines that there is the request for blocking the voltage signal VDpr. In addition, the blocking process instruction signal BO-m in the L-level output from the distribution circuit 34 propagates through the wire Wsbm branched from the wire Wbom, and is input to the control end of the switches SWbm and SWcm. As a result, one end and the other end of the switches SWbm and SWcm are controlled to be non-conductive.

The control circuit 40 determines that the abnormality occurs in the voltage value of the voltage signal VAC input to the distributed control device 1 when the blocking process instruction signal BO-m in the L-level is input during a period in which the control information signal CS-mp including the blocking request information Srq is not input, and performs the power supply blocking process. Specifically, the control circuit 40 outputs the memory control signal MC2 for reading the information held in the region of the volatile memory in the storage circuit 42. In this manner, the control circuit 40 acquires the information held in the volatile memory, and thereafter, outputs the memory control signal MC2 for storing the information acquired from the volatile memory in the non-volatile memory in the storage circuit 42. In this manner, the operation state of the main circuit 4 is stored in the non-volatile memory.

In addition, the blocking process instruction signal BO-s1 in the L-level output from the distribution circuit 34 propagates through the wire Wbo1 and the wire Wbo of the sub-circuit 5-1, is input to the control circuit 51 of the sub-circuit 5-1, propagates through the wire Wsb1 branched from the wire Wbo1, and is input to the control end of the switches SWb1 and SWc1.

One end and the other end of the switches SWb1 and SWc1 become non-conductive when the blocking process instruction signal BO-s1 in the L-level is input to the control end. As a result, the supply of the voltage signals VDa2-s1 and VDb-s1 to the sub-circuit 5-1 is stopped.

The control circuit 51 of the sub-circuit 5-1 performs the power supply blocking process when the blocking process instruction signal BO-s1 in the L-level is input. Specifically, the control circuit 51 of the sub-circuit 5-1 outputs the memory control signal MC3 for reading information held in the storage circuit **53*a* which is a volatile memory, and acquires the information held in the storage circuit 53*a*. Thereafter, the control circuit 51 of the sub-circuit 5-1 outputs the memory control signal MC4 for storing the information acquired from the storage circuit 53*a* in the storage circuit 53*b* which is a non-volatile memory. In this manner, an operation state of the sub-circuit 5-1 is stored in the storage circuit 53*b* which is the non-volatile memory. That is, when the control circuit 51 of the sub-circuit 5-1 receives the input of the blocking process instruction signal BO-s1 based on the power failure notification signal BO in the L-level indicating the abnormality of the voltage signal VAC input to the distributed control device 1, as the power supply blocking process, the control circuit 51 of the sub-circuit 5-1 performs a process for storing the information stored in the storage circuit 53*a* including the volatile memory in the storage circuit 53*b*** including the non-volatile memory.

At time t14a at which the power supply blocking process is completed, the control circuit 51 of the sub-circuit 5-1 outputs the supply stop signal SR in the H-level for stopping the supply of the voltage signal VDa1-s1 to the control circuit 51 of the sub-circuit 5-1. The supply stop signal SR in the H-level output by the control circuit 51 of the sub-circuit 5-1 propagates through the wire Wsr, and is supplied to the wire Wfs. That is, the supply stop signal SR in the H-level output by the control circuit 51 of the sub-circuit 5-1 is output from the sub-circuit 5-1 as the major error signal FE-s1 in the H-level. The major error signal FE-s1 in the H-level based on the supply stop signal SR in the H-level propagates through the wire Wfs and the wire Wfel of the sub-circuit 5-1, is input to the control circuit 30, propagates through the wire Wsa1 branched from the wire Wfel, and is input to the control end of the switch SWa1.

When the major error signal FE-si in the H-level is input, the control circuit 30 determines that the power supply blocking process in the sub-circuit 5-1 is completed, and holds the input major error signal FE-s1 in the H-level. In addition, when the major error signal FE-s1 in the H-level is input to the control end of the switch SWa1, one end and the other end become non-conductive. As a result, the supply of the voltage signal VDa1-s1 to the sub-circuit 5-1 is stopped.

Similarly, the blocking process instruction signal BO-si in the L-level output from the distribution circuit 34 propagates through the wire Wboi and the wire Wbo of the sub-circuit **5-*i*, is input to the control circuit 51 of the sub-circuit 5-*i***, propagates through the wire Wsbi branched from the wire Wboi, and is input to the control end of the switches SWbi and SWci.

One end and the other end of the switches SWbi and SWci become non-conductive when the blocking process instruction signal BO-si is input to the control end in the L-level. As a result, the supply of the voltage signals VDa2-si and VDb-si to the sub-circuit **5-*i*** is stopped.

The control circuit 51 of the sub-circuit **5-*i* performs the power supply blocking process when the blocking process instruction signal BO-si in the L-level is input. In this manner, the operation state of the sub-circuit 5-*i* is stored in the storage circuit 53*b* of the sub-circuit 5-*i*** which is the non-volatile memory.

At time t14b at which the power supply blocking process is completed, the control circuit 51 of the sub-circuit **5-*i* outputs the supply stop signal SR in the H-level for stopping the supply of the voltage signal VDa1-si to the control circuit 51 of the sub-circuit 5-*i*. The supply stop signal SR in the H-level output by the control circuit 51 of the sub-circuit 5-*i* is output from the sub-circuit 5-*i* as the major error signal FE-si in the H-level. The major error signal FE-si in the H-level based on the supply stop signal SR in the H-level propagates through the wire Wfs and the wire Wfei of the sub-circuit 5-*i*, is input to the control circuit 30**, propagates through the wire Wsai branched from the wire Wfei, and is input to the control end of the switch SWai.

When the major error signal FE-si in the H-level is input, the control circuit 30 determines that the power supply blocking process in the sub-circuit **5-*i* is completed, and holds the input major error signal FE-si in the H-level. In addition, when the major error signal FE-si in the H-level is input to the control end of the switch SWai, one end and the other end become non-conductive. As a result, the supply of the voltage signal VDa1-si to the sub-circuit 5-*i*** is stopped.

As described above, the control circuit 30 acquires and holds the major error signals FE-si to FE-sn output by each of the sub-circuits 5-1 to **5-*n*. At time t15 at which all of the logic levels of the held major error signals FE-s1 to FE-sn are in the H-level, the control circuit 30 determines that the power supply blocking process for all of the sub-circuits 5-1** to 5-*n* is completed, and outputs the control information signal CS-mr including the blocking completion information Brc indicating that the power supply blocking process for all of the sub-circuits 5-1 to 5-*n* is completed to the control circuit 40.

At time t16 at which the control information signal CS-mr including the blocking completion information Brc indicating that all of the power supply blocking processes of the sub-circuits 5-1 to 5-*n* are completed is input, the control circuit 40 outputs the supply stop signal SRm in the H-level for stopping the supply of the voltage signal VDa1-m to the control circuit 40. The supply stop signal SRm in the H-level output by the control circuit 40 propagates through the wire Wsrm, and is supplied to the wire Wfm. That is, the supply stop signal SRm in the H-level output by the control circuit 40 is output from the main circuit 4 as the major error signal FE-m in the H-level. The major error signal FE-m in the H-level based on the supply stop signal SRm in the H-level propagates through the wire Wfm and the wire Wfem of the main circuit 4, is input to the control circuit 30, propagates through the wire Wsam branched from the wire Wfem, and is input to the control end of the switch SWam. When the major error signal FE-m in the H-level is input to the control end of the switch SWam, one end and the other end become non-conductive. As a result, the supply of the voltage signal VDa1-m to the main circuit 4 is stopped. In this manner, the stop process of the distributed control device 1 when the abnormality occurs in the voltage value of the voltage signal VAC is completed.

As described above, in the distributed control device 1 of the present embodiment, when the voltage value of the voltage signal VAC which is the commercial AC power supply input to the distributed control device 1 falls below the predetermined threshold value, the relay circuit 3 outputs the blocking process instruction signal BO-m for instructing the main circuit 4 to perform the power supply blocking process in accordance with the power failure notification signal BO output by the power failure detection circuit 22, outputs the blocking process instruction signal BO-s1 for instructing the sub-circuit 5-1 to perform the power supply blocking process, and outputs the blocking process instruction signal BO-si for instructing the sub-circuit 5-*i* to perform the power-supply blocking process. That is, the main circuit 4 and the sub-circuits 5-1 to 5-*n* simultaneously perform the power supply blocking process. In this manner, even when the voltage value of the voltage signal VAC, which is the commercial AC power supply input to the distributed control device 1 falls below the predetermined threshold value, a time required for the stop process of the distributed control device 1 can be shortened.

Furthermore, in the distributed control device 1 of the present embodiment, when the voltage value of the voltage signal VAC which is the commercial AC power supply input to the distributed control device 1 falls below a predetermined threshold value, the relay circuit 3 outputs the blocking process instruction signal BO-s1 for instructing the sub-circuit 5-1 to perform the power supply blocking process in accordance with the power failure notification signal BO output by the power failure detection circuit 22, and controls the switches SWb1 and SWc1 included in the switching circuit 37-1 to be non-conductive. In this manner, the relay circuit 3 stops the supply of the voltage signals VDa2-s1 and VDb-s1 different from the voltage signal VDa1-s1 which is the drive source of the control circuit 51 of the sub-circuit 5-1 to the sub-circuit 5-1, outputs the blocking process instruction signal BO-si for instructing the sub-circuit 5-*i* to perform the power supply blocking process, and controls the switches SWbi and SWci included in the switching circuit 37-*i* to be non-conductive. In this manner, the relay circuit 3 stops the supply of the voltage signals VDa2-s1 and VDb-si different from the voltage signal VDa1-si which is the drive source of the control circuit 51 included in the sub-circuit 5-*i* to the sub-circuit 5-*i*.

That is, in the distributed control device 1 of the present embodiment, the power failure detection circuit 22 detects the voltage value of the voltage signal VAC, and when the detected voltage value is lower than the predetermined threshold value, the power failure detection circuit 22 outputs the power failure notification signal BO in the L-level indicating that the voltage signal VAC is abnormal. The switch SWb1 included in the switching circuit 37-1 stops the supply of the voltage signal VDa2-s1 to the drive module 55-1 included in the sub-circuit 5-1, specifically, the drive power supply circuit 56-1 of the drive module 55-1 included in the sub-circuit 5-1, in accordance with the blocking process instruction signal BO-s1 based on the power failure notification signal BO in the L-level. The switch SWc1 included in the switching circuit 37-1 stops the supply of the voltage signal VDb-s1 to the drive module 55-2 included in the sub-circuit 5-1, specifically, the drive power supply circuit 56-2 of the drive module 55-2 included in the sub-circuit 5-1, in accordance with the blocking process instruction signal BO-s1 based on the power failure notification signal BO in the L-level.

That is, the supply of the power supply voltage which is not required for the power supply blocking process is stopped. In this manner, power consumption when the sub-circuits 5-1 and 5-*i* perform the power supply blocking process can be reduced. As a result, a consumption amount of residual electric charge stored in the distributed control device 1 can be reduced. Therefore, a possibility that the operation of the distributed control device 1 is stopped during the power supply blocking process can be reduced.

Here, the voltage signal VAC is an example of a commercial power supply. The voltage signal VDa is an example of a first power supply voltage. The voltage signal VDb is an example of a second power supply voltage. The voltage signal VDD-sa is an example of a first drive voltage. The voltage signal VDD1 is an example of a second drive voltage. The voltage signal VDD2 is an example of a third drive voltage.

In addition, the first power supply generation circuit 21*a* is an example of a first power supply circuit. The second power supply generation circuit 21*b* is an example of a second power supply circuit. The drive power supply circuit 52 is an example of a first drive power supply circuit. The drive power supply circuit 56-1 is an example of a second drive power supply circuit. The drive power supply circuit 56-2 is an example of a third drive power supply circuit. The control circuit 51 is an example of a control circuit. The drive device 57-1 is an example of a first drive device. The drive device 57-2 is an example of a second drive device. The switch SWb1 is an example of a first switching circuit. The switch SWc1 is an example of a second switching circuit. The storage circuit 53*a* is an example of a first storage circuit. The storage circuit 53*b* is an example of a second storage circuit. The capacitor Ca is an example of a capacitive element.

In addition, the power failure notification signal BO in the L-level indicating the power failure is an example of power failure information. The blocking process instruction signal BO-s1 input to the control end of the switch SWb1 to cause the control circuit 51 to perform the power supply blocking process is an example of a first switching control signal and a blocking process instruction signal. The blocking process instruction signal BO-s1 input to the control end of the switch SWc1 is an example of a second switching control signal.

The wires Wvda, Wvda1, Wva11, and Wva1 propagating the voltage signal VDa to the drive power supply circuit 52 are examples of a first propagation path. The wires Wvda2, Wva21, and Wva2 branched from the wire Wvda and propagating the voltage signal VDa to the drive power supply circuit 56-1 are examples of a second propagation path. The wires Wvdb, Wvb1, and Wvb propagating the voltage signal VDb to the drive power supply circuit 56-2 are examples of a third propagation path.

1.3 Operational Effect

As described above, in the distributed control device 1 of the present embodiment, the power failure detection circuit 22 detects the voltage value of the voltage signal VAC. When the detected voltage value is lower than the predetermined threshold value, the power failure detection circuit 22 outputs the power failure notification signal BO in the L-level indicating that the voltage value of the voltage signal VAC is abnormal. The switch SWb1 stops the supply of the voltage signal VDa to the drive power supply circuit 56-1 in accordance with the blocking process instruction signal BO-s1 based on the power failure notification signal BO. In this manner, the drive device 57-1 stops the operation. That is, in the distributed control device 1 of the present embodiment, when the abnormality occurs in the voltage signal VAC supplied to the distributed control device 1, the supply of the voltage signal VDa to the control circuit 51 is continued, and the supply of the voltage signal VDa to the drive power supply circuit 56-1 which is the drive source of the drive device 57-1 is stopped. In this manner, a consumption amount of an electric charge stored by the voltage signal VDa can be reduced. As a result, even when the abnormality occurs in the voltage signal VAC supplied to the distributed control device 1, in a period during which the control circuit 51 performs the power supply blocking process, a possibility that an electric charge amount is insufficient and the operations of the control circuit 51 and the distributed control device 1 become unstable can be reduced.

In addition, in the distributed control device 1 of the present embodiment, the supply of the voltage signal VDa to the drive power supply circuit 56-1 is stopped in accordance with the blocking process instruction signal BO-s1 based on the power failure notification signal BO. That is, the supply of the voltage signal VDa to the drive power supply circuit 56-1 is stopped without any engagement of the main circuit 4. In this manner, when the abnormality occurs in the voltage signal VAC supplied to the distributed control device 1, the supply of the voltage signal VDa to the drive power supply circuit 56-1 can be stopped in a short time. Therefore, the consumption amount of the electric charge stored by the voltage signal VDa can be further reduced. As a result, even when the abnormality occurs in the voltage signal VAC supplied to the distributed control device 1, in a period during which the control circuit 51 performs the power supply blocking process, the possibility that the electric charge amount is insufficient and the operations of the control circuit 51 and the distributed control device 1 become unstable can be further reduced.

In addition, in the distributed control device 1 of the present embodiment, the power failure detection circuit 22 detects the voltage value of the voltage signal VAC. When the detected voltage value is lower than the predetermined threshold value, the power failure detection circuit 22 outputs the power failure notification signal BO in the L-level indicating that the voltage value of the voltage signal VAC is abnormal. The switch SWb1 stops the supply of the voltage signal VDa to the drive power supply circuit 56-1 in accordance with the blocking process instruction signal BO-s1 based on the power failure notification signal BO. The switch SWc1 stops the supply of the voltage signal VDb to the drive power supply circuit 56-2 in accordance with the blocking process instruction signal BO-s1 based on the power failure notification signal BO. In this manner, when the abnormality occurs in the voltage signal VAC supplied to the distributed control device 1, the drive device 57-2 also stops the operation. Therefore, when the control circuit 51 performs the power supply blocking process, a possibility that noise caused by the operation of the drive device 57-2 is superposed is reduced. As a result, even when the abnormality occurs in the voltage signal VAC supplied to the distributed control device 1, the possibility that the operation of the distributed control device 1 become unstable can be further reduced.

2. Specific Example of Electronic Apparatus to which Distributed Control Device is Applied Next, a configuration of a liquid ejecting apparatus 1000 serving as an example of an electronic apparatus to which the above-described distributed control device 1 is applied, and forming a desired image by ejecting a liquid on a medium P will be described. The electronic apparatus to which the above-described distributed control device 1 is applied is not limited to the liquid ejecting apparatus 1000, and can be applied to various electronic apparatuses that perform distributed control.

Figure 8:
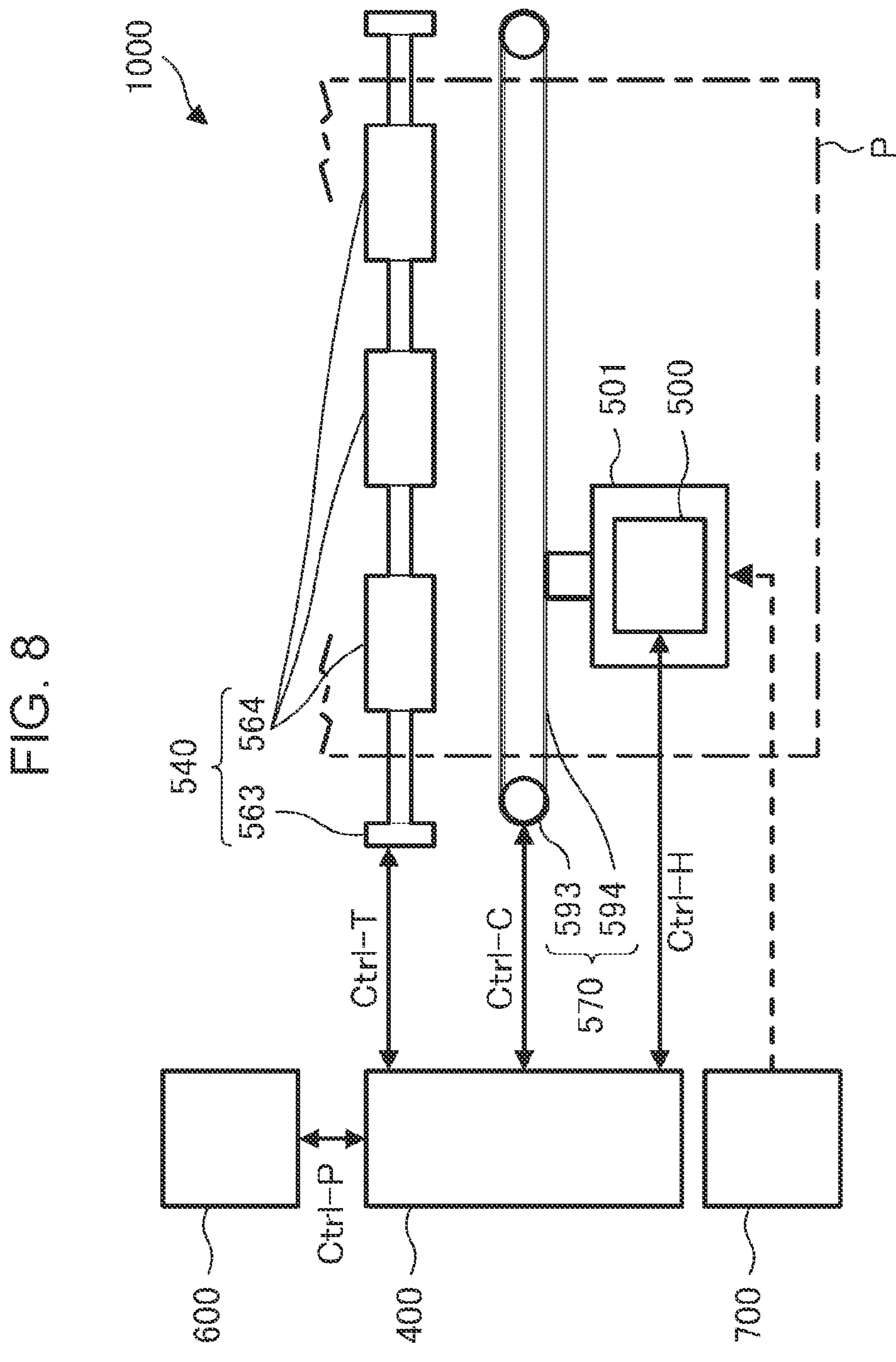
FIG. 8 is a view illustrating a schematic structure of a liquid ejecting apparatus that performs distributed control.

FIG. 8 is a view illustrating a schematic structure of the liquid ejecting apparatus 1000 that performs the distributed control. The liquid ejecting apparatus 1000 will be described by using an example of a serial printing type ink jet printer in which a carriage 501 on which an ejecting head 500 for ejecting a liquid is mounted reciprocates along a scanning axis and ejects the liquid to a medium P transported along a transport direction to form a desired image on the medium P. As the medium P used in this liquid ejecting apparatus 1000, any printing target such as a printing sheet, a resin film, and a cloth can be used.

As illustrated in FIG. 8, the liquid ejecting apparatus 1000 includes a main control circuit 400, an ejecting head 500, a transport mechanism 540, a moving mechanism 570, a user interface 600, and a liquid container 700.

The liquid container 700 stores a plurality of types of liquid to be ejected to a medium P. As the liquid container 700, an ink cartridge, a bag-shaped ink pack made of a flexible film, and an ink tank which can be replenished with the liquid can be used.

Operation information from a user is input to the user interface 600. The user interface 600 outputs user's operation information to the main control circuit 400 as a control signal Ctrl-P. For example, this user interface 600 includes an operation switch to which the user's operation information is input, and a notification unit that notifies the user of various information, and is configured to include a touch panel, for example.

For example, the main control circuit 400 includes a process circuit such as a central processing unit (CPU) and a field programmable gate array (FPGA) and a storage circuit such as a semiconductor memory. The main control circuit 400 controls each element of the liquid ejecting apparatus 1000 including the ejecting head 500, the transport mechanism 540, and the moving mechanism 570 in accordance with the input control signal Ctrl-P. In addition, as the control signal Ctrl-P, the main control circuit 400 outputs an operation status of each element of the liquid ejecting apparatus 1000 including the operation status of the ejecting head 500, the transport mechanism 540, and the moving mechanism 570, to the user interface 600. The user interface 600 notifies the user of information corresponding to the input control signal Ctrl-P.

The ejecting head 500 is mounted on a carriage 501. A control signal Ctrl-H output by the main control circuit 400 is input to the ejecting head 500. In addition, the liquid stored in the liquid container 700 is supplied to the ejecting head 500 via a tube (not illustrated). The ejecting head 500 ejects the liquid supplied from the liquid container 700, based on the control signal Ctrl-H output by the main control circuit 400.

The moving mechanism 570 includes a carriage motor 593 and an endless belt 594. The carriage motor 593 is driven, based on a control signal Ctrl-C input from the main control circuit 400. The endless belt 594 is rotated in accordance with driving of the carriage motor 593. In addition, the carriage 501 on which the ejecting head 500 is mounted is fixed to the endless belt 594. In this manner, the carriage motor 593 is driven so that the carriage 501 on which the ejecting head 500 is mounted reciprocates along a scanning axis.

The transport mechanism 540 includes a transport motor 563 and a transport roller 564. The transport motor 563 is driven, based on a control signal Ctrl-T input from the main control circuit 400. The transport roller 564 is rotated in accordance with driving of the transport motor 563. In accordance with rotation of the transport roller 564, the medium P is transported along a transport direction.

As described above, in the liquid ejecting apparatus 1000, the transport mechanism 540 controls the transport of the medium P, and the moving mechanism 570 controls the reciprocating movement of the carriage 501 along the scanning axis. In conjunction with the transport of the medium P by the transport mechanism 540 and the reciprocating movement of the carriage 501 by the moving mechanism 570, the ejecting head 500 mounted on the carriage 501 ejects the liquid to the medium P. In this manner, the liquid ejecting apparatus 1000 forms a desired image on a surface of the medium P.

A specific example of a functional configuration of the liquid ejecting apparatus 1000 that performs the distributed control configured as described above will be described with reference to FIGS. 9A and 9B. FIGS. 9A and 9B are views illustrating the specific example of the functional configuration of the liquid ejecting apparatus 1000 that performs the distributed control. As illustrated in FIGS. 9A and 9B, the liquid ejecting apparatus 1000 includes a power supply circuit 200 and a relay circuit 300 in addition to the main control circuit 400, the ejecting head 500, the transport mechanism 540, the moving mechanism 570, and the user interface 600 which are described above.

The power supply circuit 200 and the relay circuit 300 are connected to be communicable with each other by the communication signal CTpr. The relay circuit 300 and the main control circuit 400 are connected to be communicable with each other by the communication signal CTmr. The relay circuit 300 and the ejecting head 500 are connected to be communicable with each other by the communication signal CTsr1. The relay circuit 300 and the transport mechanism 540 are connected to be communicable with each other by the communication signal CTsr2. The relay circuit 300 and the moving mechanism 570 are connected to be communicable with each other by the communication signal CTsr3. The main control circuit 400 and the ejecting head 500 are connected to be communicable with each other by the communication signal CTms1 including the above-described control signal Ctrl-H. The main control circuit 400 and the transport mechanism 540 are connected to be communicable with each other by the communication signal CTms2 including the above-described control signal Ctrl-T. The main control circuit 400 and the moving mechanism 570 are connected to be communicable with each other by the communication signal CTms3 including the above-described control signal Ctrl-C. The main control circuit 400 and the user interface 600 are connected to be communicable with each other by the communication signal CTmp including the above-described control signal Ctrl-P.

In the liquid ejecting apparatus 1000 configured as described above, the power supply circuit 200, the relay circuit 300, the main control circuit 400, the ejecting head 500, the transport mechanism 540, the moving mechanism 570, and the user interface 600 are independently operated, and are connected to be communicable with each other by the corresponding communication signals CTpr, CTmr, CTsr1 to CTsr3, CTms1 to CTms3, and CTmp. Accordingly, the mutual cooperation is achieved, and the distributed control is performed. As a result, even when a process load of the entire apparatus increases due to an increase in a size of the liquid ejecting apparatus 1000, a possibility that the process load is concentrated on a specific configuration is reduced, and a possibility that an unintended process delay occurs or a possibility that operational stability is lowered is reduced.

The power supply circuit 200 includes a power supply generation circuit 210 and a power failure detection circuit 220. The power supply generation circuit 210 generates and outputs the voltage signal VDpr as a DC voltage used in various configurations of the liquid ejecting apparatus 1000 from the commercial power supply voltage input to the liquid ejecting apparatus 1000. The power failure detection circuit 220 detects the voltage value of the commercial power supply voltage input to the liquid ejecting apparatus 1000. This power supply circuit 200 corresponds to the power supply circuit 2 of the above-described distributed control device 1. The power supply generation circuit 210 corresponds to the power supply generation circuit 20 of the above-described distributed control device 1. The power failure detection circuit 220 corresponds to the power failure detection circuit 22 of the above-described distributed control device 1. That is, the power supply generation circuit 210 outputs the DC voltage having a plurality of voltage values corresponding to the voltage signals VDa and VDb as the voltage signal VDpr, and the power failure detection circuit 220 outputs a signal corresponding to the power failure notification signal BO corresponding to whether or not the detected voltage value is equal to or higher than the predetermined threshold value, as the communication signal CTpr.

The relay circuit 300 includes a control circuit 310, a storage circuit 320, a signal distribution circuit 330, a power supply output control circuit 350, and switching circuits 360 and 370-1 to 370-3. The relay circuit 300 corresponds to the relay circuit 3 of the above-described distributed control device 1.

The control circuit 310 is responsible for controlling various configurations of the relay circuit 300, and achieves the cooperation by causing various configurations of the liquid ejecting apparatus 1000 to communicate with each other. This control circuit 310 corresponds to the control circuit 30 of the above-described distributed control device 1.

The storage circuit 320 stores various information corresponding to the operation state of the relay circuit 300 and communication information with the power supply circuit 200, the main control circuit 400, the ejecting head 500, the transport mechanism 540, and the moving mechanism 570. This storage circuit 320 corresponds to the storage circuit 31 of the above-described distributed control device 1.

The power failure notification signal BO output by the power failure detection circuit 220 of the power supply circuit 200 is input to the signal distribution circuit 330 as the communication signal CTpr. The signal distribution circuit 330 delays the input power failure notification signal BO. Thereafter, the power failure notification signal BO is distributed corresponding to each of the main control circuit 400, the ejecting head 500, the transport mechanism 540, and the moving mechanism 570, and is output to each of the main control circuit 400, the ejecting head 500, the transport mechanism 540, and the moving mechanism 570. This signal distribution circuit 330 corresponds to the delay distribution circuit 32 of the above-described distributed control device 1.

The power supply output control circuit 350 generates the communication signal CTpr for controlling the output of the voltage signal VDpr from the power supply generation circuit 210 of the power supply circuit 200, and outputs the communication signal CTpr to the power supply circuit 200. In this manner, the presence or absence of the output of the voltage signal VDpr from the power supply circuit 200 is controlled. This power supply output control circuit 350 corresponds to the power supply output control circuit 35 of the above-described distributed control device 1.

The relay circuit 300 relays the input voltage signal VDpr to be branched corresponding to each of the main control circuit 400, the ejecting head 500, the transport mechanism 540, and the moving mechanism 570. In this case, the switching circuit 360 includes a plurality of switch circuits, and switches whether or not to supply at least one of the branched voltage signals VDpr to the main control circuit 400. The switching circuit 370-1 includes a plurality of switch circuits, and switches whether or not to supply at least one of the branched voltage signals VDpr to the ejecting head 500. The switching circuit 370-2 includes a plurality of switch circuits, and switches whether or not to supply at least one of the branched voltage signals VDpr to the transport mechanism 540. The switching circuit 370-3 includes a plurality of switch circuits, and switches whether or not to supply at least one of the branched voltage signals VDpr to the moving mechanism 570. That is, the switching circuit 360 corresponds to the switching circuit 36 of the above-described distributed control device 1. The switching circuit 370-1 corresponds to the switching circuit 37-1 of the above-described distributed control device 1. The switching circuit 370-2 corresponds to the switching circuit 37-2 of the above-described distributed control device 1. The switching circuit 370-3 corresponds to the switching circuit 37-3 of the above-described distributed control device 1.

The main control circuit 400 includes a control circuit 410, a storage circuit 420, a drive power supply circuit 430, a major error detection circuit 440, and a minor error detection circuit 450. This main control circuit 400 corresponds to the main circuit 4 of the above-described distributed control device 1.

The drive power supply circuit 430 converts the voltage signal VDmr corresponding to the voltage signal VDpr input via the relay circuit 300 into a DC voltage having a predetermined voltage value used in the main control circuit 400. Various configurations included in the main control circuit 400 are operated by using the DC voltage output by the drive power supply circuit 430 as the drive source. This drive power supply circuit 430 corresponds to the drive power supply circuit 41 of the above-described distributed control device 1.

The control circuit 410 is operated by using the DC voltage output by the drive power supply circuit 430 as the drive source. In this manner, the control circuit 410 controls the operation of various configurations of the main control circuit 400 and generally managing the entire operation of the liquid ejecting apparatus 1000. Furthermore, the control circuit 410 achieves the cooperation by causing various configurations of the liquid ejecting apparatus 1000 to communicate with each other. This control circuit 410 corresponds to the control circuit 40 of the above-described distributed control device 1.

The storage circuit 420 stores various information corresponding to an operation state of the main control circuit 400 and communication information among the relay circuit 300, the main control circuit 400, the ejecting head 500, the transport mechanism 540, the moving mechanism 570, and the user interface 600. This storage circuit 420 corresponds to the storage circuit 42 of the above-described distributed control device 1.

The major error detection circuit 440 detects whether or not the major abnormality occurs in the main control circuit 400, and outputs a signal corresponding to a detection result to the relay circuit 300 as the communication signal CTmr. In addition, the minor error detection circuit 450 detects whether or not the minor abnormality occurs in the main control circuit 400, and outputs a signal corresponding to a detection result to the relay circuit 300 as the communication signal CTmr. This major error detection circuit 440 corresponds to the major error detection circuit 43 in the above-described distributed control device 1, and the minor error detection circuit 450 corresponds to the minor error detection circuit 44 in the above-described distributed control device 1.

The ejecting head 500 includes an ejecting control module 510, a drive signal output module 520, and an ejecting module 530. The ejecting head 500 ejects a predetermined amount of the liquid at a predetermined timing corresponding to the control signal Ctrl-H included in the communication signal CTms1 output by the main control circuit 400. This ejecting head 500 is one of the plurality of sub-circuits 5 of the above-described distributed control device 1, and corresponds to the sub-circuit 5-1, for example.

The ejecting control module 510 includes an ejecting control circuit 511, a drive power supply circuit 512, and a storage circuit 513. The ejecting control module 510 controls the operations of the ejecting control module 510, the drive signal output module 520, and the ejecting module 530 in accordance with the control signal Ctrl-H included in the communication signal CTms1 output by the main control circuit 400. This ejecting control module 510 corresponds to the control module 50 included in the sub-circuit 5-1 in the plurality of sub-circuits 5 of the above-described distributed control device 1.

The drive power supply circuit 512 converts the voltage signal VDsr1 corresponding to the voltage signal VDpr input via the relay circuit 300 into the DC voltage having a predetermined voltage value used in the ejecting control module 510. Various configurations included in the ejecting control module 510 are operated by using the DC voltage output by the drive power supply circuit 512 as the drive source. This drive power supply circuit 512 corresponds to the drive power supply circuit 52 of the sub-circuit 5-1 of the above-described distributed control device 1.

The ejecting control circuit 511 is operated by using the DC voltage output by the drive power supply circuit 512 as the drive source. In this manner, the ejecting control circuit 511 controls the operations of various configurations of the ejecting head 500 in accordance with the control signal Ctrl-H output by the main control circuit 400. Furthermore, the ejecting control circuit 511 achieves the cooperation by causing various configurations of the liquid ejecting apparatus 1000 to communicate with each other. This ejecting control circuit 511 corresponds to the control circuit 51 of the sub-circuit 5-1 of the above-described distributed control device 1.

The storage circuit 513 stores various information corresponding to the operation state of the ejecting head 500 and communication information between the relay circuit 300 and the main control circuit 400. This storage circuit 513 corresponds to the storage circuit 53 of the sub-circuit 5-1 of the above-described distributed control device 1.

The drive signal output module 520 includes a drive power supply circuit 521, a drive signal output circuit 522, a major error detection circuit 523, and a minor error detection circuit 524. The drive signal output module 520 generates and outputs a drive signal for ejecting the liquid from the ejecting head 500, under the control of the ejecting control module 510. This drive signal output module 520 corresponds to the drive module 55-1 included in the sub-circuit 5-1 in the plurality of sub-circuits 5 of the above-described distributed control device 1.

The drive power supply circuit 521 converts the voltage signal VDsr1 corresponding to the voltage signal VDpr input via the relay circuit 300 into the DC voltage having a predetermined voltage value used by the drive signal output module 520. Various configurations included in the drive signal output module 520 are operated by using the DC voltage output by the drive power supply circuit 521 as the drive source. This drive power supply circuit 521 corresponds to the drive power supply circuit 56-1 of the sub-circuit 5-1 of the above-described distributed control device 1.

The drive signal output circuit 522 generates and outputs a drive signal having a predetermined signal waveform defined by the ejecting control module 510. This drive signal output circuit 522 corresponds to the drive device 57-1 of the sub-circuit 5-1 of the above-described distributed control device 1.

The major error detection circuit 523 detects whether or not the major abnormality occurs in the drive signal output module 520, and outputs a signal corresponding to a detection result to the relay circuit 300 as the communication signal CTsr1. Here, for example, the major abnormality occurring in the drive signal output module 520 includes an abnormality of the voltage value of the input voltage signal VDsr1, an abnormality of a current value generated based on the voltage signal VDsr1, and an excessive increase in the temperature. In addition, the minor error detection circuit 524 detects whether or not the minor abnormality occurs in the drive signal output module 520, and outputs a signal corresponding to a detection result to the relay circuit 300 as the communication signal CTsr1. Here, the minor abnormality occurring in the drive signal output module 520 includes when the output drive signal waveform is distorted due to superposition of noise. This major error detection circuit 523 corresponds to the major error detection circuit **58*a*-1 of the sub-circuit 5-1 of the above-described distributed control device 1, and the minor error detection circuit 524 corresponds to the minor error detection circuit 58*b*-1 of the sub-circuit 5-1 of the above-described distributed control device 1**.

The ejecting module 530 includes a drive power supply circuit 531, a liquid ejecting head 532, a major error detection circuit 533, and a minor error detection circuit 534. The ejecting module 530 ejects the liquid to the medium P in accordance with a drive signal output by the drive signal output module 520, under the control of the ejecting control module 510. This ejecting module 530 corresponds to the drive module 55-2 included in the sub-circuit 5-1 in the plurality of sub-circuits 5 of the above-described distributed control device 1.

The drive power supply circuit 531 converts the voltage signal VDsr1 corresponding to the voltage signal VDpr input via the relay circuit 300 into the DC voltage having a predetermined voltage value used in the ejecting module 530. Various configurations included in the ejecting module 530 are operated by using the DC voltage output by the drive power supply circuit 531 as the drive source. This drive power supply circuit 531 corresponds to the drive power supply circuit 56-2 of the sub-circuit 5-1 of the above-described distributed control device 1.

At a timing defined by the ejecting control module 510, the liquid ejecting head 532 ejects the amount of the liquid corresponding to the drive signal output by the drive signal output module 520. For example, the liquid ejecting head 532 may adopt a configuration including a piezoelectric element so that the piezoelectric element is displaced in accordance with a drive signal to eject the liquid. Alternatively, the liquid ejecting head 532 may adopt a configuration including a heat generating element so that the heat generating element generates heat in accordance with a drive signal to eject the liquid. This liquid ejecting head 532 corresponds to the drive device 57-2 of the sub-circuit 5-1 of the above-described distributed control device 1.

The major error detection circuit 533 detects whether or not the major abnormality occurs in the ejecting module 530, and outputs a signal corresponding to a detection result to the relay circuit 300 as the communication signal CTsr1. Here, for example, the major abnormality occurring in the ejecting module 530 includes an abnormality of the voltage value of the input voltage signal VDsr1, an abnormality of a current value generated based on the voltage signal VDsr1, and an excessive increase in the temperature. In addition, the minor error detection circuit 534 detects whether or not the minor abnormality occurs in the ejecting module 530, and outputs a signal corresponding to a detection result to the relay circuit 300 as the communication signal CTsr1. Here, the minor abnormality occurring in the ejecting module 530 includes deterioration in the ejecting accuracy of the ejected liquid caused by distortion of the drive signal waveform and deterioration in the ejecting accuracy of the liquid based on temperature characteristics of the ejected liquid. This major error detection circuit 533 corresponds to the major error detection circuit **58*a*-2 of the sub-circuit 5-1 of the above-described distributed control device 1, and the minor error detection circuit 524 corresponds to the minor error detection circuit 58*b*-2 of the sub-circuit 5-1 of the distributed control device 1**.

The transport mechanism 540 includes a transport control module 550 and a transport module 560. The transport mechanism 540 transports the medium P at a predetermined timing corresponding to the control signal Ctrl-T included in the communication signal CTms2 output by the main control circuit 400. The transport mechanism 540 is one of the plurality of sub-circuits 5 of the above-described distributed control device 1, and corresponds to the sub-circuit 5-2, for example.

The transport control module 550 includes a transport control circuit 551, a drive power supply circuit 552, and a storage circuit 553. The transport control module 550 controls the operations of the transport control module 550 and the transport module 560 in accordance with the control signal Ctrl-T included in the communication signal CTms2 output by the main control circuit 400. This transport control module 550 corresponds to the control module 50 included in the sub-circuit 5-2 in the plurality of sub-circuits 5 of the above-described distributed control device 1.

The drive power supply circuit 552 converts the voltage signal VDsr2 corresponding to the voltage signal VDpr input via the relay circuit 300 into the DC voltage having a predetermined voltage value used in the transport control module 550. Various configurations included in the transport control module 550 are operated by using the DC voltage output by the drive power supply circuit 552 as the drive source. This drive power supply circuit 552 corresponds to the drive power supply circuit 52 of the sub-circuit 5-2 of the above-described distributed control device 1.

The transport control circuit 551 is operated by using the DC voltage output by the drive power supply circuit 552 as the drive source. In this manner, the transport control circuit 551 controls the operations of various configurations of the transport mechanism 540 in accordance with the control signal Ctrl-T output by the main control circuit 400. Furthermore, the transport control circuit 551 achieves the cooperation by causing various configurations of the liquid ejecting apparatus 1000 to communicate with each other. This transport control circuit 551 corresponds to the control circuit 51 of the sub-circuit 5-2 of the above-described distributed control device 1.

The storage circuit 553 stores various information corresponding to the operation state of the transport mechanism 540 and communication information between the relay circuit 300 and the main control circuit 400. This storage circuit 553 corresponds to the storage circuit 53 of the sub-circuit 5-2 of the above-described distributed control device 1.

The transport module 560 includes a drive power supply circuit 561, a transport motor 563, a transport roller 564, a transport position detection sensor 565, a major error detection circuit 566, and a minor error detection circuit 567. The transport module 560 transports the medium P under the control of the transport control module 550. This transport module 560 corresponds to the drive module 55-1 included in the sub-circuit 5-2 in the plurality of sub-circuits 5 of the above-described distributed control device 1.

The drive power supply circuit 561 converts the voltage signal VDsr2 corresponding to the voltage signal VDpr input via the relay circuit 300 into the DC voltage having a predetermined voltage value used in the transport module 560. Various configurations included in the transport module 560 are operated by using the DC voltage output by the drive power supply circuit 561 as the drive source. This drive power supply circuit 561 corresponds to the drive power supply circuit 56-1 of the sub-circuit 5-2 of the above-described distributed control device 1.

The transport motor 563 is driven under the control of the transport control module 550. The transport motor 563 is driven to rotationally drive the transport roller 564 and to transport the medium P. In addition, the transport position detection sensor 565 detects a transport position of the medium P transported by driving the transport motor 563 and the transport roller 564, and outputs the transport position of the medium P corresponding to a detection result to the transport control circuit 551. At least one of the transport motor 563, the transport roller 564, and the transport position detection sensor 565 corresponds to the drive device 57-1 of the sub-circuit 5-2 of the above-described distributed control device 1.

The major error detection circuit 566 detects whether or not the major abnormality occurs in the transport module 560, and outputs a signal corresponding to a detection result to the relay circuit 300 as the communication signal CTsr2. Here, for example, the major abnormality occurring in the transport module 560 includes an abnormality of the voltage value of the input voltage signal VDsr2, an abnormality of a current value generated based on the voltage signal VDsr2, and an excessive increase in the temperature. In addition, the minor error detection circuit 567 detects whether or not the minor abnormality occurs in the transport module 560, and outputs a signal corresponding to a detection result to the relay circuit 300 as the communication signal CTsr2. Here, the minor abnormality occurring in the transport module 560 includes paper jam of the transported medium P. This major error detection circuit 566 corresponds to the major error detection circuit **58*a*-1 of the sub-circuit 5-2 of the above-described distributed control device 1, and the minor error detection circuit 567 corresponds to the minor error detection circuit 58*b*-1 of the sub-circuit 5-2 of the distributed control device 1**.

The moving mechanism 570 includes a carriage control module 580 and a carriage moving module 590. The moving mechanism 570 moves the carriage 501 at a predetermined timing corresponding to the control signal Ctrl-C included in the communication signal CTms3 output by the main control circuit 400. This moving mechanism 570 is one of the plurality of sub-circuits 5 of the above-described distributed control device 1, and corresponds to the sub-circuit 5-3, for example.

The carriage control module 580 includes a moving control circuit 581, a drive power supply circuit 582, and a storage circuit 583. The carriage control module 580 controls the operations of the carriage control module 580 and the carriage moving module 590 in accordance with the control signal Ctrl-C included in the communication signal CTms3 output by the main control circuit 400. This carriage control module 580 corresponds to the control module 50 included in the sub-circuit 5-3 in the plurality of sub-circuits 5 of the above-described distributed control device 1.

The drive power supply circuit 582 converts the voltage signal VDsr3 corresponding to the voltage signal VDpr input via the relay circuit 300 into the DC voltage having a predetermined voltage value used in the carriage control module 580. Various configurations included in the carriage control module 580 are operated by using the DC voltage output by the drive power supply circuit 582 as the drive source. This drive power supply circuit 582 corresponds to the drive power supply circuit 52 of the sub-circuit 5-3 of the above-described distributed control device 1.

The moving control circuit 581 is operated by using the DC voltage output by the drive power supply circuit 582 as the drive source. In this manner, the moving control circuit 581 controls the operations of various configurations of the moving mechanism 570 in accordance with the control signal Ctrl-C output by the main control circuit 400. Furthermore, the moving control circuit 581 achieves the cooperation by causing various configurations of the liquid ejecting apparatus 1000 to communicate with each other.

This moving control circuit 581 corresponds to the control circuit 51 of the sub-circuit 5-3 of the above-described distributed control device 1.

The storage circuit 583 stores various information corresponding to the operation state of the moving mechanism 570 and communication information between the relay circuit 300 and the main control circuit 400. This storage circuit 583 corresponds to the storage circuit 53 of the sub-circuit 5-3 of the above-described distributed control device 1.

The carriage moving module 590 includes a drive power supply circuit 591, a carriage motor 593, an endless belt 594, a scanning position detection sensor 595, a major error detection circuit 596, and a minor error detection circuit 597. The carriage moving module 590 moves the carriage 501 under the control of the carriage control module 580. This carriage moving module 590 corresponds to the drive module 55-1 included in the sub-circuit 5-3 in the plurality of sub-circuits 5 included in the above-described distributed control device 1.

The drive power supply circuit 591 converts the voltage signal VDsr3 corresponding to the voltage signal VDpr input via the relay circuit 300 into the DC voltage having a predetermined voltage value used in the carriage moving module 590. Various configurations included in the carriage moving module 590 are operated by using the DC voltage output by the drive power supply circuit 591 as the drive source. This drive power supply circuit 591 corresponds to the drive power supply circuit 56-1 of the sub-circuit 5-3 of the above-described distributed control device 1.

The carriage motor 593 is driven under the control of the carriage control module 580. The carriage motor 593 is driven to rotationally drive the endless belt 594 and to move the carriage 501 fixed to the endless belt 594. In addition, the scanning position detection sensor 595 detects a scanning position of the carriage 501 moved by driving the carriage motor 593 and the endless belt 594, that is, a scanning position of the ejecting head 500 mounted on the carriage 501, and outputs the scanning position of the carriage 501 corresponding to a detection result to the moving control circuit 581. At least one of the carriage motor 593, the endless belt 594, and the scanning position detection sensor 595 corresponds to the drive device 57-1 of the sub-circuit 5-3 of the above-described distributed control device 1.

The major error detection circuit 596 detects whether or not the major abnormality occurs in the carriage moving module 590, and outputs a signal corresponding to a detection result to the relay circuit 300 as the communication signal CTsr3. Here, for example, the major abnormality occurring in the carriage moving module 590 includes an abnormality of the voltage value of the input voltage signal VDsr3, an abnormality of a current value generated based on the voltage signal VDsr3, and an excessive increase in the temperature. In addition, the minor error detection circuit 597 detects whether or not the minor abnormality occurs in the carriage moving module 590, and outputs a signal corresponding to a detection result to the relay circuit 300 as the communication signal CTsr3. Here, the minor abnormality occurring in the carriage moving module 590 includes deterioration in liquid ejecting characteristics based on a scanning position abnormality of the moving carriage 501. This major error detection circuit 596 corresponds to the major error detection circuit **58*a*-1 of the sub-circuit 5-3 of the above-described distributed control device 1, and the minor error detection circuit 597 corresponds to the minor error detection circuit 58*b*-1 of the sub-circuit 5-3 of the above-described distributed control device 1**.

Even in the liquid ejecting apparatus 1000 configured as described above, each of the power supply circuit 200, the relay circuit 300, the main control circuit 400, the ejecting head 500, the transport mechanism 540, the moving mechanism 570, and the user interface 600 performs the same operation as that of each of the power supply circuit 2, the relay circuit 3, the main circuit 4, the plurality of sub-circuits 5, and the user interface 6 of the above-described distributed control device 1. In this manner, the same operational effect is achieved as in the above-described distributed control device 1.

3. Distributed Control System

Next, an example of a distributed control system 100 will be described. In describing the example of the distributed control system 100, the same reference numerals will be assigned to the same configurations as those of the distributed control device 1, and description thereof will be simplified or omitted.

Figure 10:
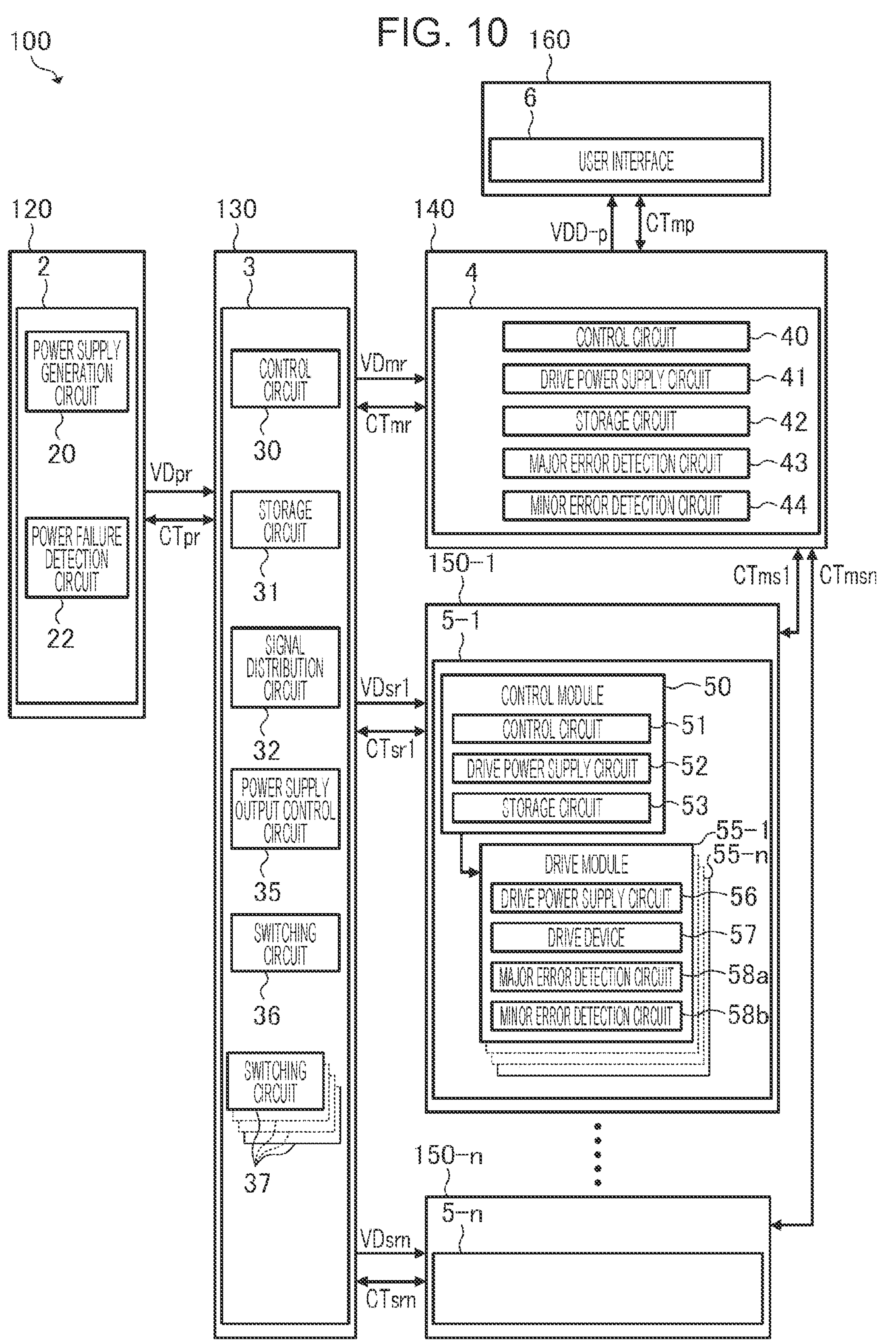
FIG. 10 is a diagram illustrating an example of a distributed control system of the present embodiment.

FIG. 10 is a view illustrating an example of the distributed control system 100 of the present embodiment. As illustrated in FIG. 10, the distributed control system 100 of the present embodiment includes a power supply terminal 120 including the power supply circuit 2 of the above-described distributed control device 1, a relay terminal 130 including the relay circuit 3 of the above-described distributed control device 1, a main terminal 140 including the main circuit 4 of the above-described distributed control device 1, sub-terminals 150-1 to **150-*n* including each of the sub-circuits 5-1 to 5-*n* of the above-described distributed control device 1, and an interface terminal 160 including the user interface 6 of the distributed control device 1. For example, at least some of the power supply terminal 120, the relay terminal 130, the main terminal 140, the sub-terminals 150-1 to 150-*n*, and the interface terminal 160** form a controller area network (CAN), and are connected to be communicable with each other to perform the distributed control.

Specifically, in the distributed control system 100 of the present embodiment, the power supply terminal 120 receives the input of the voltage signal VAC as the commercial power supply, and outputs the voltage signal VDpr including the voltage signals VDa and VDb which are the DC voltages. Specifically, the power supply terminal 120 includes the first power supply generation circuit **21*a* to which the voltage signal VAC as the commercial power supply is input and which outputs the voltage signal VDa as the DC voltage, and the second power supply generation circuit 21*b* to which the voltage signal VAC as the commercial power supply is input and which outputs the voltage signal VDb as the DC voltage. In addition, the power supply terminal 120 includes the power failure detection circuit 22** which detects the voltage value of the voltage signal VAC as the commercial power supply, and outputs the power failure notification signal BO corresponding to whether or not the detected voltage value is lower than the predetermined threshold value, as the communication signal CTpr.

In addition, in the distributed control system 100 of the present embodiment, the voltage signal VDmr corresponding to the voltage signal VDpr is supplied to the main terminal 140 via the relay terminal 130. The main terminal 140 is operated by using the voltage signal VDpr output by the power supply terminal 120 as the drive source, and controls the operations of the sub-terminals 150-1 to **150-*n*. Specifically, the main terminal 140 includes the control circuit 40 that controls the operations of the sub-terminals 150-1 to 150-*n***.

In addition, in the distributed control system 100 of the present embodiment, the voltage signal VDsr1 corresponding to the voltage signal VDpr is supplied to the sub-terminal 150-1 via the relay terminal 130. The sub-terminal 150-1 includes the drive power supply circuit 52 to which the voltage signal VDa1 in the voltage signal VDsr1 corresponding to the voltage signal VDpr is supplied and which outputs the voltage signal VDD-sa, the drive power supply circuit 56-1 to which the voltage signal VDa2 in the voltage signal VDsr1 corresponding to the voltage signal VDpr is supplied and which outputs the voltage signal VDD1, the control circuit 51 operated by using the voltage signal VDD-sa as the drive source, and the drive device 57-1 operated by using the voltage signal VDD1 as the drive source under the control of the control circuit 51.

In addition, in the distributed control system 100 of the present embodiment, the voltage signal VDsri corresponding to the voltage signal VDpr is supplied to the sub-terminal 150-*i* via the relay terminal 130. The sub-terminal 150-*i* includes the drive power supply circuit 52 to which the voltage signal VDa1 in the voltage signal VDsri corresponding to the voltage signal VDpr is supplied and which outputs the voltage signal VDD-sa, the drive power supply circuit 56-1 to which the voltage signal VDa2 in the voltage signal VDsri corresponding to the voltage signal VDpr is supplied and which outputs the voltage signal VDD1, the control circuit 51 operated by using the voltage signal VDD-sa as the drive source, and the drive device 57-1 operated by using the voltage signal VDD1 as the drive source under the control of the control circuit 51.

In addition, in the distributed control system 100 of the present embodiment, the relay terminal 130 is electrically coupled to the sub-terminals 150-1 to 150-*n* including the sub-terminal 150-1 and the sub-terminal 150-*i*, the main terminal 140, and the power supply terminal 120. The relay terminal 130 includes switching circuits 37-1 to 37-*n*.

The switching circuit 37-1 includes the switch SWa1 provided in the propagation path propagating the voltage signal VDsr1 corresponding to the voltage signal VDpr supplied to the sub-terminal 150-1 to switch whether or not to supply the voltage signal VDa1 to the sub-terminal 150-1, the switch SWb1 that switches whether or not to supply the voltage signal VDa2 to the sub-terminal 150-1, and the switch SWc1 that switches whether or not to supply the voltage signal VDb to the sub-terminal 150-1. The switching circuit 37-*i* includes the switch SWai provided in the propagation path propagating the voltage signal VDsri corresponding to the voltage signal VDpr supplied to the sub-terminal 150-*i* and that switches whether or not to supply the voltage signal VDa1 to the sub-terminal 150-*i*, the switch SWbi that switches whether or not to supply the voltage signal VDa2 to the sub-terminal 150-*i*, and the switch Swci that switches whether or not to supply the voltage signal VDb to the sub-terminal 150-*i*.

In the distributed control system 100 of the present embodiment, as in the above-described distributed control device 1, the power failure detection circuit 22 detects the voltage value of the voltage signal VAC. When the detected voltage value is lower than the predetermined threshold value, the power failure detection circuit 22 outputs the power failure notification signal BO in the L-level indicating that the voltage signal VAC is abnormal. The switch SWb1 included in the switching circuit 37-1 stops the supply of the voltage signal VDa2-s1 to the drive module 55-1 included in the sub-terminal 150-1, specifically, the drive power supply circuit 56-1 of the drive module 55-1 included in the sub-terminal 150-*i*, in accordance with the blocking process instruction signal BO-s1 based on the power failure notification signal BO in the L-level. The switch SWbi included in the switching circuit 37-*i* stops the supply of the voltage signal VDa2-s1 to the drive module 55-1 included in the sub-terminal 150-1, specifically, the drive power supply circuit 56-1 of the drive module 55-1 included in the sub-terminal 150-*i*, in accordance with the blocking process instruction signal BO-si based on the power failure notification signal BO in the L-level.

Even the distributed control system 100 configured as described above achieves the same operational effect as that of the above-described distributed control device 1.

Hitherto, the embodiments and the modification examples have been described. However, the present disclosure is not limited to the embodiments, and can be implemented in various aspects within the scope not departing from the concept of the present disclosure. For example, the above-described embodiments can also be appropriately combined with each other.

The present disclosure includes substantially the same configurations (for example, configurations having the same functions, methods, and results, or configurations having the same objects and effects) as the configurations described in the embodiments. In addition, the present disclosure includes configurations in which non-essential parts of the configuration described in the embodiments are replaced. In addition, the present disclosure includes configurations that achieve the same operational effects or configurations that can achieve the same objects as those of the configurations described in the embodiment. In addition, the present disclosure includes configurations in which a known technology is added to the configurations described in the embodiments.

The following contents are derived from the above-described embodiments.

According to an aspect, there is provided a distributed control device including a first power supply circuit to which a commercial power supply is input and which outputs a first power supply voltage, a power failure detection circuit that detects a voltage value of the commercial power supply and outputs a power failure notification signal according to whether or not the detected voltage value is lower than a predetermined threshold value; and a first drive power supply circuit to which the first power supply voltage is supplied and that outputs a first drive voltage, a second drive power supply circuit to which the first power supply voltage is supplied and that outputs a second drive voltage, a control circuit that operates using the first drive voltage as a drive source, a first drive device that uses the second drive voltage as a drive source and operates under the control of the control circuit, a first propagation path propagating the first power supply voltage to the first drive power supply circuit, a second propagation path branching from the first propagation path and propagating the first power supply voltage to the second drive power supply circuit, and a first switching circuit that is provided in the second propagation path and switches whether or not to supply the first power supply voltage to the second drive power supply circuit. The power failure detection circuit detects a voltage value of the commercial power supply, and when the detected voltage value is lower than the predetermined threshold value, outputs the power failure notification signal including power failure information indicating that the commercial power supply is abnormal. The first switching circuit stops the supply of the first power supply voltage to the second drive power supply circuit in accordance with a first switching control signal based on the power failure notification signal including the power failure information.

In the distributed control device, the control circuit is operated by using the first drive voltage based on the first power supply voltage as the drive source, and the first drive device is operated by using the second drive voltage based on the first power supply voltage as the drive source. That is, both the control circuit and the first drive device controlled by the control circuit are driven by receiving the first power supply voltage. In this distributed control device, when the power failure detection circuit detects the voltage value of the commercial power supply and the detected voltage value is lower than the predetermined threshold value, the power failure detection circuit outputs the power failure notification signal including the power failure information indicating that the commercial power supply is abnormal. The first switching circuit stops the supply of the first power supply voltage to the second drive power supply circuit in accordance with the first switching control signal based on the power failure notification signal including the power failure information. That is, when the supply of the commercial power supply to the distributed control device is stopped, the supply of the power supply voltage to the first drive device is stopped. In this manner, the consumption amount of an electric charge when the supply of the commercial power supply to the distributed control device is stopped is reduced. As a result, when the supply of the commercial power supply to the distributed control device is stopped, a possibility that the stop process of the control circuit is not completed due to an insufficient electric charge is reduced, and stability of the distributed control device is improved.

In the aspect of the distributed control device, the second power supply circuit to which the commercial power supply is input and which outputs the second power supply voltage different from the first power supply voltage, the third drive power supply circuit to which the second power supply voltage is supplied and which outputs the third drive voltage, the second drive device operated by using the third drive voltage as the drive source under the control of the control circuit, the third propagation path propagating the second power supply voltage to the third drive power supply circuit, and the second switching circuit provided in the third propagation path to switch whether or not to supply the second power supply voltage to the third drive power supply circuit. The second switching circuit may stop the supply of the second power supply voltage to the third drive power supply circuit in accordance with the second switching control signal based on the power failure notification signal including the power failure information.

According to this distributed control device, when the supply of the power supply voltage to the distributed control device is stopped, the second drive device different from the control circuit stops the operation. In this manner, a possibility that noise generated by driving the second drive device is superposed on the process performed by the control circuit, and a possibility that a malfunction occurs in the distributed control device is reduced.

In the aspect of the distributed control device, the control circuit may perform the power supply blocking process when the blocking process instruction signal based on the power failure notification signal including the power failure information is input.

According to this distributed control device, the control circuit performs the power supply blocking process, based on the power failure notification signal. In this manner, a time required for the power supply blocking process can be shortened. As a result, a possibility that the stop process of the control circuit is not completed due to the insufficient electric charge is reduced, and stability of the distributed control device is improved.

In the aspect of the distributed control device, the first storage circuit including the volatile memory, and the second storage circuit including the non-volatile memory. The control circuit may store the information stored in the first storage circuit in the second storage circuit, as the power supply blocking process.

According to this distributed control device, the information stored in the first storage circuit is stored in the second storage circuit in a period during which the control circuit performs the power supply blocking process. In this manner, even when the supply of the power supply voltage to the distributed control device is stopped, an operation state of the distributed control device can be held.

In the aspect of the distributed control device, the power failure notification signal may be distributed, may be input to the control circuit as the blocking process instruction signal, and may be input to the first switching circuit as the first switching control signal.

According to this distributed control device, the first switching control signal is input to the first switching circuit without any engagement of firmware. In this manner, a time required until the control circuit completes the power supply blocking process can be shortened.

In the aspect of the distributed control device may include a capacitive element electrically coupled to the first propagation path.

According to this distributed control device, the capacitive element electrically coupled to the first propagation path is provided. In this manner, the amount of the electric charge held by the distributed control device is increased. As a result, a possibility that the electric charge is insufficient is reduced, a possibility that the stop process of the control circuit is not completed is further reduced, and stability of the operation of the distributed control device is improved. According to this distributed control device, a possibility that the stop process of the control circuit is not completed due to the insufficient electric charge is reduced. Therefore, the capacitive element having a small capacitance can be used. As a result, a size of the distributed control device can be reduced.

According to another aspect, there is provided a distributed control system including a power supply terminal to which a commercial power supply is input and which outputs a first power supply voltage, a relay terminal electrically coupled to the power supply terminal, and a sub-terminal to which the first power supply voltage is supplied via the relay terminal, and the power supply terminal includes a first power supply circuit to which the commercial power supply is input and which outputs the first power supply voltage, a power failure detection circuit that detects a voltage value of the commercial power supply and outputs a power failure notification signal according to whether or not the detected voltage value is lower than a predetermined threshold value. The sub-terminal includes a first drive power supply circuit to which the first power supply voltage is supplied and that outputs a first drive voltage, a second drive power supply circuit to which the first power supply voltage is supplied and that outputs a second drive voltage, a control circuit that operates using the first drive voltage as a drive source, a first drive device that uses the second drive voltage as a drive source and operates under the control of the control circuit, the relay terminal may have a first switching circuit that switches whether or not to supply the first power supply voltage to the second drive power supply circuit, and the first power supply voltage supplied to the first drive power supply circuit propagates through a first propagation path, the first power supply voltage supplied to the second drive power supply circuit branches from the first propagation path and propagates through a second propagation path, the first switching circuit is provided in the second propagation path, the power failure detection circuit detects a voltage value of the commercial power supply, and when the detected voltage value is lower than the predetermined threshold value, outputs the power failure notification signal including power failure information indicating that the commercial power supply is abnormal. The first switching circuit stops the supply of the first power supply voltage to the second drive power supply circuit in accordance with a first switching control signal based on the power failure notification signal including the power failure information.

According to this distributed control system, the control circuit is operated by using the first drive voltage based on the first power supply voltage as the drive source, and the first drive device is operated by using the second drive voltage based on the first power supply voltage as the drive source. That is, both the control circuit and the first drive device controlled by the control circuit are driven by receiving the first power supply voltage. In this distributed control system, when the power failure detection circuit detects the voltage value of the commercial power supply and the detected voltage value is lower than the predetermined threshold value, the power failure detection circuit outputs the power failure notification signal including the power failure information indicating that the commercial power supply is abnormal, and the first switching circuit stops the supply of the first power supply voltage to the second drive power supply circuit in accordance with the first switching control signal based on the power failure notification signal including the power failure information. That is, when the supply of the commercial power supply to the distributed control device is stopped, the supply of the power supply voltage to the first drive device is stopped. In this manner, the consumption amount of an electric charge when the supply of the commercial power supply to the distributed control device is stopped is reduced. As a result, when the supply of the commercial power supply to the distributed control device is stopped, a possibility that the stop process of the control circuit is not completed due to an insufficient electric charge is reduced, and stability of the distributed control device is improved.

What is claimed is:

1. A distributed control device comprising:

a first power supply circuit to which a commercial power supply is input and that outputs a first power supply voltage;

a power failure detection circuit that detects a voltage value of the commercial power supply and outputs a power failure notification signal corresponding to whether or not the detected voltage value is lower than a predetermined threshold value;

a first drive power supply circuit to which the first power supply voltage is supplied and that outputs a first drive voltage;

a second drive power supply circuit to which the first power supply voltage is supplied and that outputs a second drive voltage;

a control circuit operated by using the first drive voltage as a drive source;

a first drive device operated by using the second drive voltage as a drive source under control of the control circuit;

a first propagation path propagating the first power supply voltage to the first drive power supply circuit;

a second propagation path branched from the first propagation path to propagate the first power supply voltage to the second drive power supply circuit; and a first switching circuit provided in the second propagation path to switch whether or not to supply the first power supply voltage to the second drive power supply circuit, wherein the power failure detection circuit detects a voltage value of the commercial power supply, and outputs the power failure notification signal including power failure information indicating that the commercial power supply is abnormal, when the detected voltage value is lower than the predetermined threshold value, and the first switching circuit stops the supply of the first power supply voltage to the second drive power supply circuit in accordance with a first switching control signal based on the power failure notification signal including the power failure information.

2. The distributed control device according to claim 1, further comprising:

a second power supply circuit to which the commercial power supply is input and that outputs a second power supply voltage different from the first power supply voltage;

a third drive power supply circuit to which the second power supply voltage is supplied and that outputs a third drive voltage;

a second drive device operated by using the third drive voltage as a drive source under the control of the control circuit;

a third propagation path propagating the second power supply voltage to the third drive power supply circuit; and a second switching circuit provided in the third propagation path to switch whether or not to supply the second power supply voltage to the third drive power supply circuit, wherein the second switching circuit stops the supply of the second power supply voltage to the third drive power supply circuit in accordance with a second switching control signal based on the power failure notification signal including the power failure information.

3. The distributed control device according to claim 1, wherein when a blocking process instruction signal based on the power failure notification signal including the power failure information is input, the control circuit performs a power supply blocking process.

4. The distributed control device according to claim 3, further comprising:

a first storage circuit including a volatile memory; and a second storage circuit including a non-volatile memory, wherein the control circuit stores information stored in the first storage circuit in the second storage circuit, as the power supply blocking process.

5. The distributed control device according to claim 3, wherein the power failure notification signal is distributed, is input to the control circuit as the blocking process instruction signal, and is input to the first switching circuit as the first switching control signal.

6. The distributed control device according to claim 1, further comprising:

a capacitive element electrically coupled to the first propagation path.

7. A distributed control system comprising:

a power supply terminal to which a commercial power supply is input and that outputs a first power supply voltage;

a relay terminal electrically coupled to the power supply terminal; and a sub-terminal to which the first power supply voltage is supplied via the relay terminal, wherein the power supply terminal includes a first power supply circuit to which the commercial power supply is input and that outputs the first power supply voltage, and a power failure detection circuit that detects a voltage value of the commercial power supply and outputs a power failure notification signal corresponding to whether or not the detected voltage value is lower than a predetermined threshold value, the sub-terminal includes a first drive power supply circuit to which the first power supply voltage is supplied and that outputs a first drive voltage, a second drive power supply circuit to which the first power supply voltage is supplied and that outputs a second drive voltage, a control circuit operated by using the first drive voltage as a drive source, and a first drive device operated by using the second drive voltage as a drive source under control of the control circuit, the relay terminal includes a first switching circuit that switches whether or not to supply the first power supply voltage to the second drive power supply circuit, the first power supply voltage supplied to the first drive power supply circuit propagates through a first propagation path, the first power supply voltage supplied to the second drive power supply circuit is branched from the first propagation path and propagates through a second propagation path, the first switching circuit is provided in the second propagation path, the power failure detection circuit detects a voltage value of the commercial power supply, and outputs the power failure notification signal including power failure information indicating that the commercial power supply is abnormal, when the detected voltage value is lower than the predetermined threshold value, and the first switching circuit stops supply of the first power supply voltage to the second drive power supply circuit in accordance with a first switching control signal based on the power failure notification signal including the power failure information.

* * * * *